US007440324B2

(12) United States Patent
Mokhlesi

(10) Patent No.: US 7,440,324 B2
(45) Date of Patent: Oct. 21, 2008

(54) APPARATUS WITH ALTERNATING READ MODE

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/618,578

(22) Filed: Dec. 29, 2006

(65) Prior Publication Data

US 2008/0158974 A1 Jul. 3, 2008

(51) Int. Cl.
*G11C 16/04* (2006.01)

(52) U.S. Cl. ............................ 365/185.17; 365/185.18; 365/185.21; 365/185.23

(58) Field of Classification Search ............ 365/185.17, 365/185.18, 185.21, 185.23, 185.24, 201
See application file for complete search history.

(56) References Cited

U.S. PATENT DOCUMENTS

| | | | |
|---|---|---|---|
| 5,532,962 | A | 7/1996 | Auclair |
| 5,539,690 | A | 7/1996 | Talreja |
| 5,657,332 | A | 8/1997 | Auclair |
| 5,764,572 | A | 6/1998 | Hammick |
| 5,862,074 | A | 1/1999 | Park |
| 5,867,429 | A | 2/1999 | Chen |
| 5,943,260 | A | 8/1999 | Hirawawa |
| 5,946,231 | A | 8/1999 | Endoh |
| 5,995,417 | A | 11/1999 | Chen et al. |
| 6,044,019 | A | 3/2000 | Cernea |
| 6,046,935 | A | 4/2000 | Takeuchi |
| 6,107,658 | A | 8/2000 | Itoh |
| 6,144,580 | A | 11/2000 | Murray |
| 6,154,157 | A | 11/2000 | Wong |
| 6,160,739 | A | 12/2000 | Wong |
| 6,175,522 | B1 | 1/2001 | Fang |
| 6,181,599 | B1 | 1/2001 | Gongwer |
| 6,222,762 | B1 | 4/2001 | Guterman |
| 6,259,632 | B1 | 7/2001 | Khouri |

(Continued)

FOREIGN PATENT DOCUMENTS

| | | |
|---|---|---|
| DE | 10164149 | 7/2002 |

(Continued)

OTHER PUBLICATIONS

Notice of Allowance, dated Aug. 23, 2007, U.S. Appl. No. 11/421,884, filed Jun. 2, 2006.

(Continued)

*Primary Examiner*—David Lam
(74) *Attorney, Agent, or Firm*—Vierra Magen Marcus & DeNiro LLP

(57) ABSTRACT

Shifts in the apparent charge stored on a floating gate (or other charge storage element) of a non-volatile memory cell can occur because of the coupling of an electric field based on the charge stored in adjacent floating gates (or other charge storing elements). To account for this coupling, the read process for a targeted memory cell will provide compensation to an adjacent memory cell (or other memory cell) in order to reduce the coupling effect that the adjacent memory cell has on the targeted memory cell. The compensation applied is based on a condition of the adjacent memory cell. To apply the correct compensation, the read process will at least partially intermix read operations for the adjacent memory cell with read operations for the targeted memory cell.

25 Claims, 15 Drawing Sheets

U.S. PATENT DOCUMENTS

| | | | | |
|---|---|---|---|---|
| 6,285,593 | B1 | 9/2001 | Wong | |
| 6,345,000 | B1 | 2/2002 | Wong | |
| 6,349,055 | B1 | 2/2002 | Murray | |
| 6,363,014 | B1 * | 3/2002 | Fastow | 365/185.18 |
| 6,418,061 | B1 | 7/2002 | Kitazaki | |
| 6,456,528 | B1 | 9/2002 | Chen | |
| 6,462,988 | B1 | 10/2002 | Harari | |
| 6,504,762 | B1 | 1/2003 | Harari | |
| 6,522,580 | B2 | 2/2003 | Chen | |
| 6,532,556 | B1 | 3/2003 | Wong | |
| 6,535,423 | B2 | 3/2003 | Trivedi | |
| 6,542,407 | B1 | 4/2003 | Chen | |
| 6,570,785 | B1 | 5/2003 | Mangan | |
| 6,570,790 | B1 | 5/2003 | Harari | |
| 6,614,070 | B1 | 9/2003 | Hirose | |
| 6,643,188 | B2 | 11/2003 | Tanaka | |
| 6,657,891 | B1 | 12/2003 | Shibata | |
| 6,717,847 | B2 | 4/2004 | Chen | |
| 6,717,851 | B2 | 4/2004 | Mangan | |
| 6,760,068 | B2 | 7/2004 | Petropoulos | |
| 6,771,536 | B2 | 8/2004 | Li | |
| 6,781,877 | B2 | 8/2004 | Cernea | |
| 6,807,095 | B2 | 10/2004 | Chen | |
| 6,859,397 | B2 | 2/2005 | Lutze | |
| 6,870,766 | B2 | 3/2005 | Cho | |
| 6,870,768 | B2 | 3/2005 | Cernea | |
| 6,888,758 | B1 | 5/2005 | Hemink | |
| 6,956,770 | B2 | 10/2005 | Khalid | |
| 6,975,538 | B2 | 12/2005 | Abedifard et al. | |
| 7,009,881 | B2 | 3/2006 | Noguchi | |
| 7,020,017 | B2 | 3/2006 | Chen | |
| 7,170,788 | B1 | 1/2007 | Wan | |
| 2002/0051383 | A1 | 5/2002 | Mangan | |
| 2002/0126532 | A1 | 9/2002 | Matsunaga | |
| 2003/0112663 | A1 | 6/2003 | Quader | |
| 2003/0128586 | A1 | 7/2003 | Chen | |
| 2003/0137888 | A1 | 7/2003 | Chen | |
| 2003/0161182 | A1 | 8/2003 | Li | |
| 2003/0218920 | A1 | 11/2003 | Harari | |
| 2004/0012998 | A1 | 1/2004 | Chien | |
| 2004/0027865 | A1 | 2/2004 | Mangan | |
| 2004/0042270 | A1 | 3/2004 | Huang | |
| 2004/0047182 | A1 | 3/2004 | Cernea | |
| 2004/0057283 | A1 | 3/2004 | Cernea | |
| 2004/0057285 | A1 | 3/2004 | Cernea | |
| 2004/0057287 | A1 | 3/2004 | Cernea | |
| 2004/0057318 | A1 | 3/2004 | Cernea | |
| 2004/0060031 | A1 | 3/2004 | Cernea | |
| 2004/0079988 | A1 | 4/2004 | Harari | |
| 2004/0080980 | A1 | 4/2004 | Lee | |
| 2004/0109357 | A1 | 6/2004 | Cernea | |
| 2004/0156241 | A1 | 8/2004 | Mokhlesi | |
| 2004/0179404 | A1 | 9/2004 | Quader | |
| 2004/0190337 | A1 | 9/2004 | Chen | |
| 2004/0213031 | A1 | 10/2004 | Hosono | |
| 2005/0057967 | A1 | 3/2005 | Khalid | |
| 2005/0157564 | A1 | 7/2005 | Hosono | |
| 2005/0162913 | A1 | 7/2005 | Chen | |
| 2005/0174852 | A1 | 8/2005 | Hemink | |
| 2005/0254302 | A1 | 11/2005 | Noguchi | |
| 2006/0120161 | A1 | 6/2006 | Confalonieri | |
| 2006/0221692 | A1 | 10/2006 | Chen | |
| 2007/0047314 | A1 | 3/2007 | Goda | |
| 2007/0121383 | A1 | 5/2007 | Chen | |
| 2007/0206421 | A1 | 9/2007 | Mokhlesi | |
| 2007/0206426 | A1 | 9/2007 | Mokhlesi | |
| 2007/0279995 | A1 | 12/2007 | Mokhlesi | |

FOREIGN PATENT DOCUMENTS

| | | |
|---|---|---|
| EP | 01271553 | 1/2003 |
| EP | 01329898 | 1/2003 |
| WO | 03025512 | 3/2003 |
| WO | 2005104135 | 11/2005 |
| WO | 2006107731 | 10/2006 |
| WO | 2007078793 | 7/2007 |
| WO | 2007089370 | 8/2007 |

OTHER PUBLICATIONS

U.S. Appl. No. 11/618,569, filed Dec. 29, 2006.

U.S. Appl. No. 11/421,871, filed Jun. 2, 2006.

U.S. Appl. No. 11/421,884, filed Jun. 2, 2006.

U.S. Appl. No. 11/377,972, filed Mar. 17, 2006.

U.S. Appl. No. 11/384,057, filed Mar. 17, 2006.

Office Action, dated Sep. 24, 2007, U.S. Appl. No. 11/421,871, filed Jun. 2, 2006.

U.S. Appl. No. 11/296,055, filed Dec. 6, 2005.

U.S. Appl. No. 60/791,365, filed Apr. 12, 2006.

U.S. Appl. No. 11/377,972, filed Mar. 17, 2006, titled, "System for Performing Read Operation on Non-Volatile Storage With Compensation for Coupling," by Mokhlesi.

International Search Report dated Jan. 28, 2008, PCT Appl. PCT/US2007/069590.

Written Opinion of the International Searching Authority dated Jan. 28, 2008; PCT Appl. PCT/US2007/069590.

Notice of Allowance dated Mar. 27, 2008, U.S. Pat. No. 11/377,972, filed Mar. 17, 2006.

Office Action dated Apr. 1. 2008, U.S. Pat. No. 11/933,649, filed Nov. 1, 2007.

Aritome, "Reliability Issues of Flash Memory Cells," Proceedings of the IEEE, IEEE. New York, vol. 81, No. 5, May 1, 1993.

Notice of Allowance dated Apr. 29, 2008, U.S. Pat. No. 11/384,057, filed Mar. 17, 2006.

International Search Report, dated Apr. 21, 2008.

Written Opinion of the International Searching Authority, dated Apr. 21, 2008.

Notice of Allowance dated May 19, 2008, U.S. Pat. Appl. No. 11/421,871, filed May 19, 2008.

Office Action dated May 14, 2008, U.S. Pat. Appl. No. 11/618,569, filed Dec. 29, 2006.

International Search Report dated May 28, 2008, PCT/US2007/088787.

Written Opinion Of The International Searching Authority dated May 28, 2008.

* cited by examiner

| Wordline | Upper/ Lower Page | All Bit Lines |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |

| | | | | |
|---|---|---|---|---|
| Upper | 1 | 0 | 1 | 0 |
| Lower | 1 | 1 | 0 | 0 |

APPARATUS WITH ALTERNATING READ MODE

CROSS-REFERENCE TO RELATED APPLICATIONS

The following application is cross-referenced and incorporated by reference herein in its entirety: U.S. patent application Ser. No. 11/618,569, entitled "Alternating Read Mode," Inventor Nima Mokhlesi, filed the same day as the present application, incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" and in U.S. Pat. No. 6,917,542, titled "Detecting Over Programmed Memory;" both patents are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device. Thus, threshold voltage range can be referred to as a data state.

Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are diagonal from the target floating gate because they are on both a neighboring bit line and neighboring word line.

The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range or to another allowed threshold voltage range.

As memory cells continue to shrink in size, the natural programming and erase distributions of threshold voltages are expected to increase due to short channel effects, greater oxide thickness/coupling ratio variations and more channel dopant fluctuations. The increase in distributions of threshold voltages may reduce the available separation between adjacent data states. Thus, the increase in distributions of threshold voltages will exacerbate the problem of coupling between adjacent floating gates Furthermore, the reduction of the space between word lines and of the space between bit lines will also increase the coupling between adjacent floating gates.

Thus, there is a need to reduce the effect of coupling between floating gates.

SUMMARY OF THE INVENTION

To account for the coupling based on the charge stored in neighboring floating gates (or other charge storing elements), the read process for a targeted memory cell will provide compensation to a neighbor memory cell (or other memory cell) in order to reduce the coupling effect that the neighbor memory cell has on the targeted memory cell. The compensation applied is based on a condition of the neighbor memory cell. To apply the correct compensation, the read process will at least partially intermix read operations for the neighbor memory cell with read operations for the targeted memory cell.

One embodiment includes performing a set of read operations on a target non-volatile storage element as part of a common attempt to read a particular data value stored in the target non-volatile storage element, performing a group of read operations on the neighbor non-volatile storage element, choosing information from a subset of the set of read operations based on the group of read operations, and reporting the data value stored in the target non-volatile storage element based on the chosen information. The group of read operations are at least partially temporally intermixed with the set of read operations. At least a subset of the set of read operations applies different voltages to a neighbor non-volatile storage element.

One embodiment includes determining a perceived condition of a particular non-volatile storage element based on a group of read operations on the particular non-volatile storage element and performing a set of read operations on a targeted non-volatile storage element. The particular non-volatile storage element is next to the targeted non-volatile storage element. At least a subset of the set of read operations is performed between the group of read operations. Different subsets of the set of read operations apply different voltages to the particular non-volatile storage element. Different voltages pertain to different potential conditions of the particular non-volatile storage element. One of the subsets of the set of read operations correlates to the perceived condition. The process also includes identifying data in the targeted non-volatile storage element based on the one of the subsets of the set of read operations that correlates to the perceived condition.

One embodiment includes testing a particular non-volatile storage element for a first condition, performing a first read process for a targeted non-volatile storage element, identifying data from the targeted non-volatile storage element based on the first read process if the particular non-volatile storage element satisfies the first condition, testing the particular non-volatile storage element for a second condition after performing the first read process, performing a second read process for the targeted non-volatile storage element, and identifying data from the targeted non-volatile storage element based on the second read process if the particular non-volatile storage element satisfies the second condition. The first read process includes applying a first voltage to the particular non-volatile storage element. The particular non-volatile storage element is next to the targeted non-volatile storage element. The second read process includes applying a second voltage to the particular non-volatile storage element. In one example implementation, the testing for the first condition occurs prior to the first read process, and the testing for the second condition occurs after the step of identifying data from the targeted non-volatile storage element based on the first read process and prior to the second read process. The first voltage is associated with the first condition and the second voltage is associated with the second condition.

One example implementation comprises a plurality of non-volatile storage elements and one or more managing circuits in communication with the plurality of non-volatile storage elements for performing the processes discussed herein.

DETAILED DESCRIPTION

Figure 1:
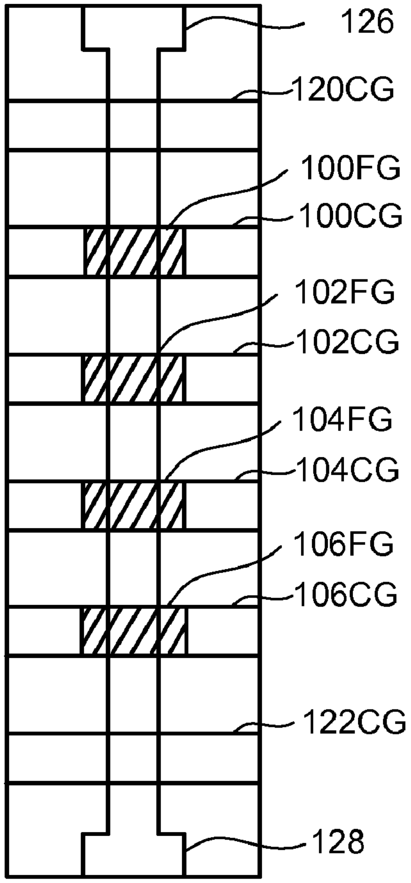
FIG. 1 is a top view of a NAND string.
Figure 2:
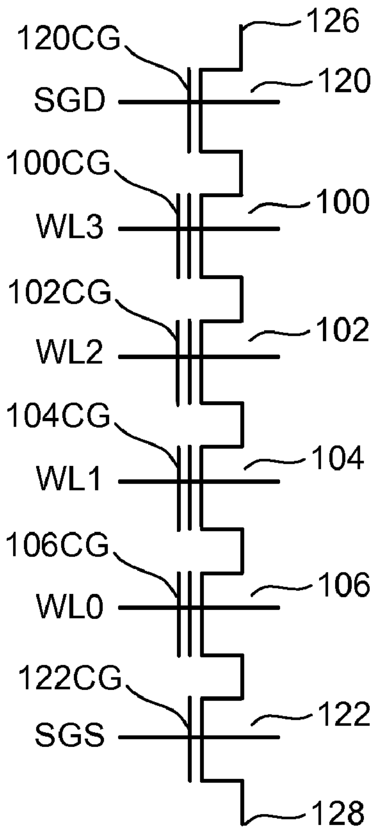
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information is stored (three bits of data), there will be eight threshold voltage ranges assigned to the data values "000", "001", "010", "011" "100", "101", "110" and "111" The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
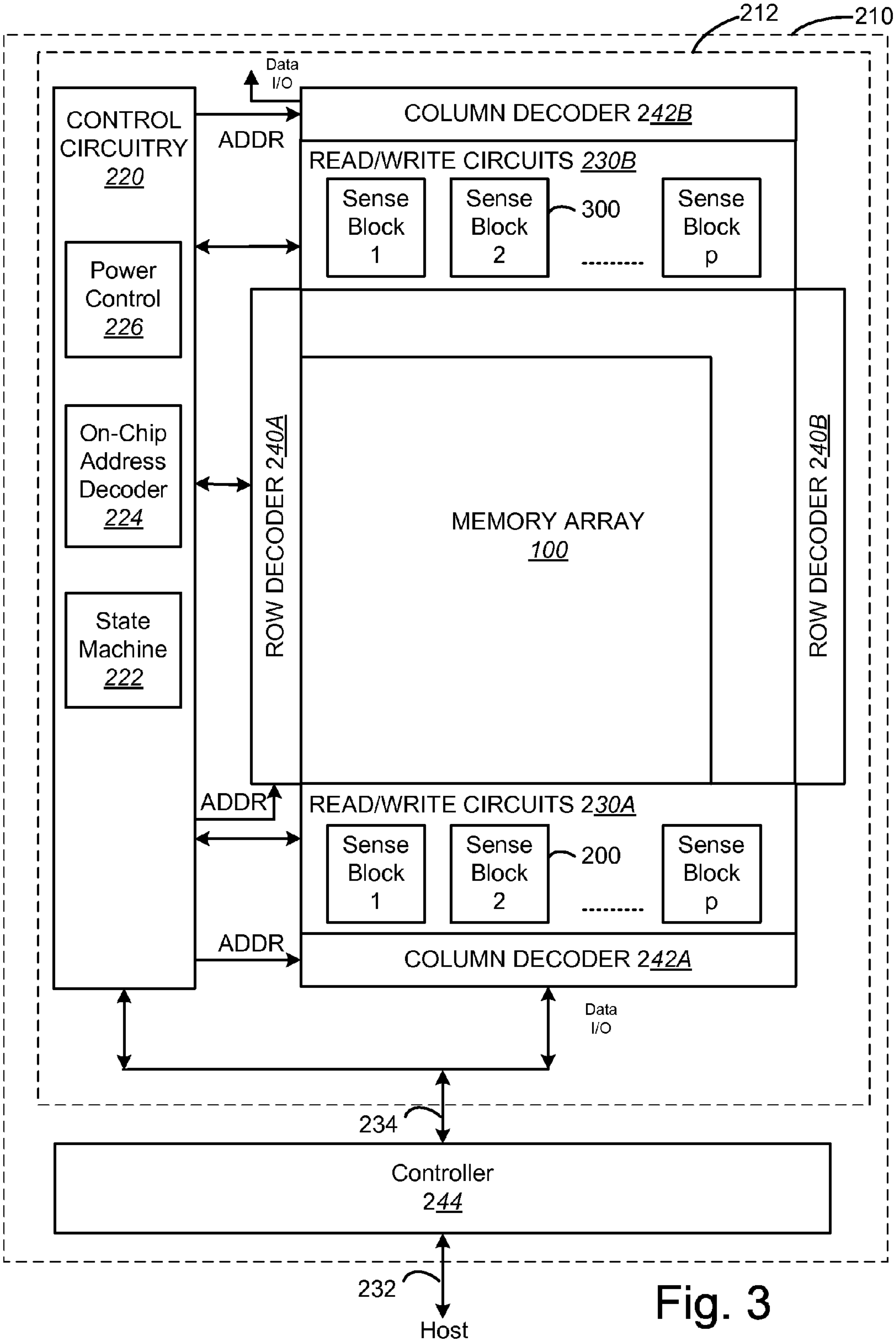
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 221, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
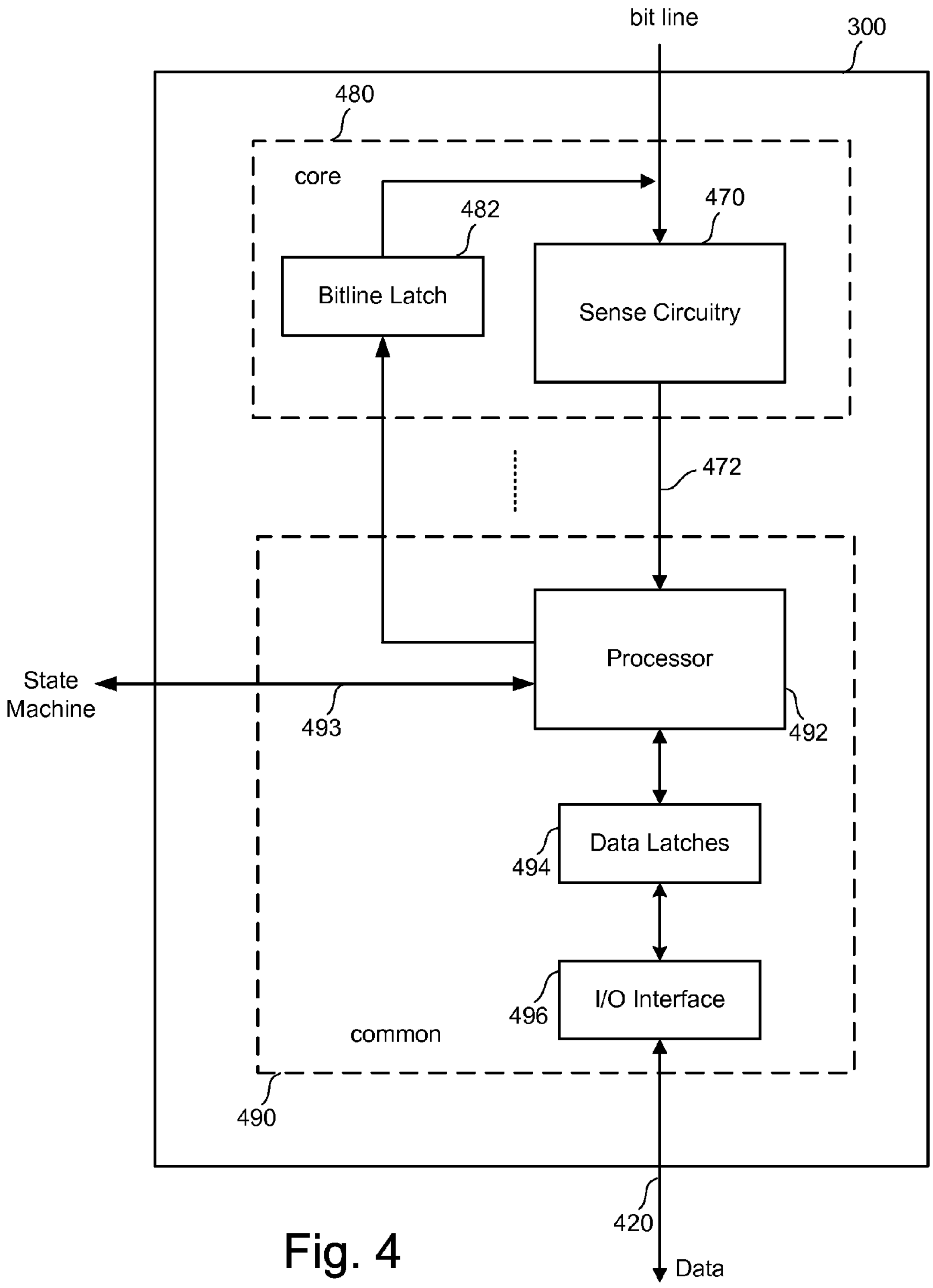
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. Since a sense module is associated with a bit line (and, thus, a NAND string in a particular block), then there are three data latches (e.g., L1, L2 and L3) per NAND string. Thus, a particular memory cell and its neighbors on the same NAND string share a common set of three latches. In one embodiment, the latches are each one bit.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
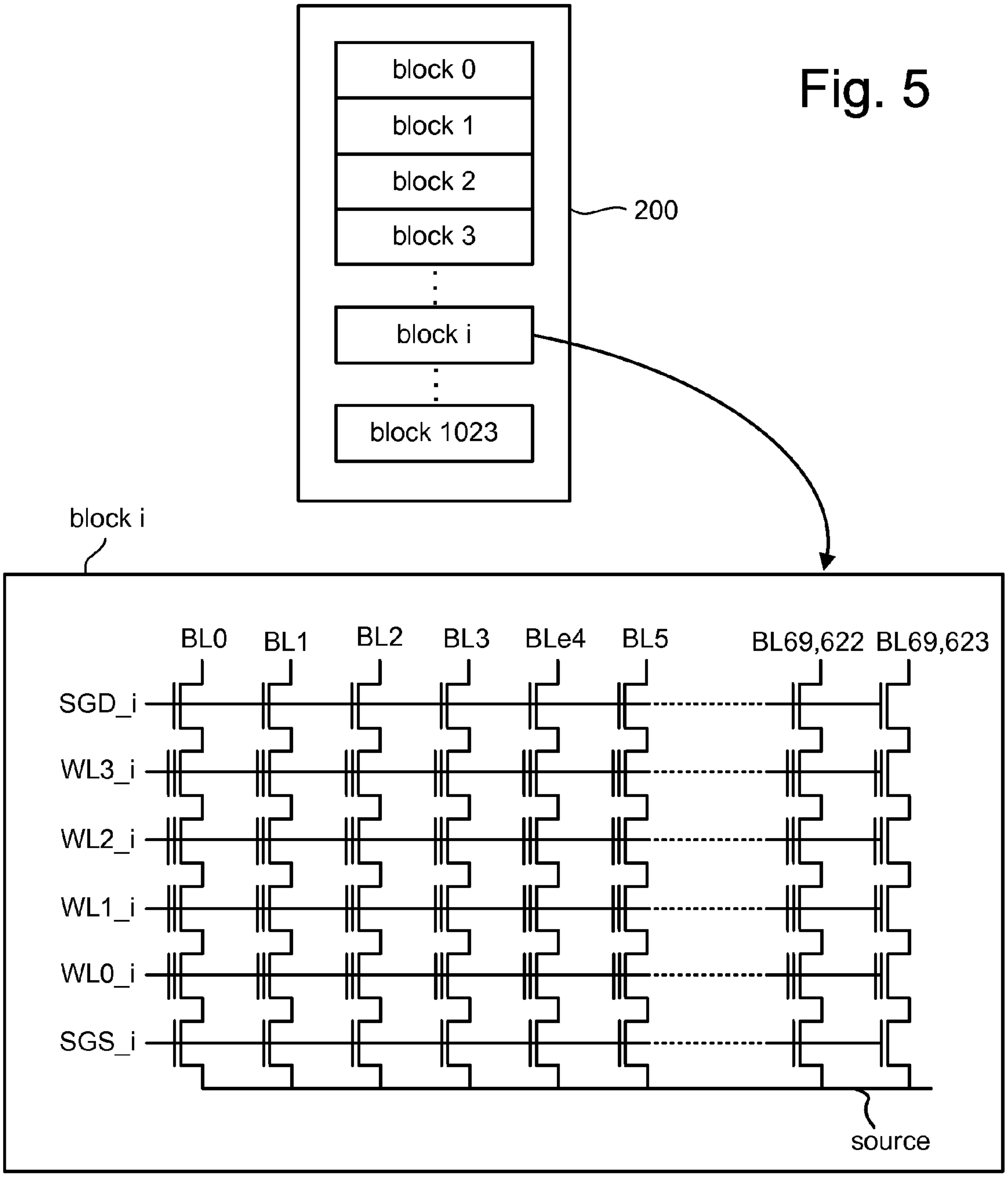
FIG. 5 is a block diagram depicting one embodiment of a memory array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Figures 6, 8:
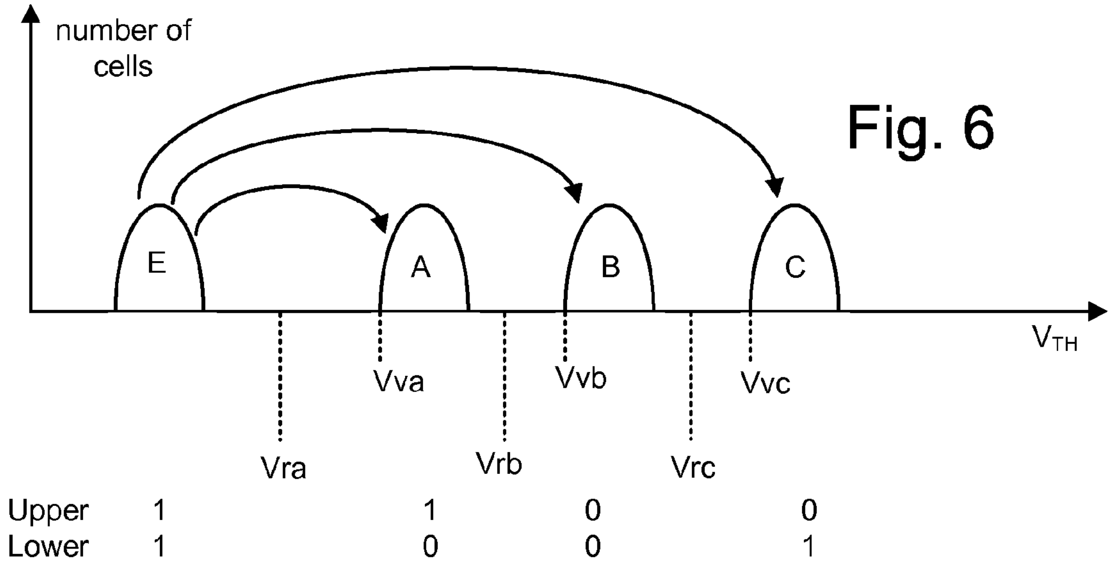
FIG. 6 depicts an example set of threshold voltage distributions and describes a process for programming non-volatile memory.
FIG. 8 is a table depicting one example of an order of programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions for the memory cell array when each memory cell stores two bits of data. Other embodiment, however, may use more or less than two bits of data per memory cell (e.g., such as three bits of data per memory cell). FIG. 6 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. One example assigns “11” to threshold voltage range E (state E), “10” to threshold voltage range A (state A), “00” to threshold voltage range B (state B) and “01” to threshold voltage range C (state C). However, in other embodiments, Gray code is not used.

In one embodiment, the two bits of data for each state are in different pages. With reference to state E for the process of FIG. 6, both pages store a “1.” With respect to state A, the upper page stores bit 1 and the lower page stores bit 0. With reference to state B, both pages store a “0.” With reference to state C, the upper page stores bit 0 and the lower page stores bit 1.

Figure 11:
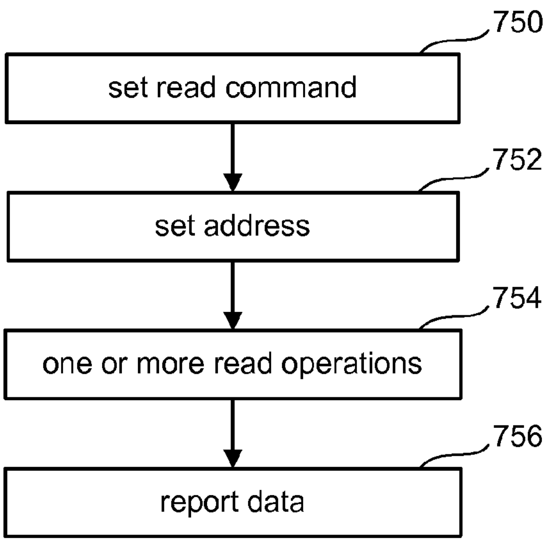
FIG. 11 depicts a flow chart describing one embodiment of a process for reading non-volatile memory.

In another embodiment, the two bits of data for each state are in the same page. Although FIG. 11 shows four states, the present invention can also be used with other multi-state structures including those that include more or less than four states.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in. Example values of Vra, Vrb and Vrc include Vra=0v, Vrb=1.25v, and Vrc=2.65v. Another set of examples includes Vra=0v, Vrb=1.35v, and Vrc=2.6v. Other example values of Vra, Vrb and Vrc are 00V, 1.25V, and 2.5V, respectively. Other values can also be used.

FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. Example values of Vva, Vvb and Vvc include Vva=0.40v, Vvb=1.80v, and Vvc=3.35v. Another set of examples include Vva=0.5v, Vvb=1.9v, and Vvc=3.3v. Other example values of Vva, Vvb and Vvc are 0.5V, 1.8V, and 3.2V respectively. Other values can also be used.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 6.

Figure 7A:
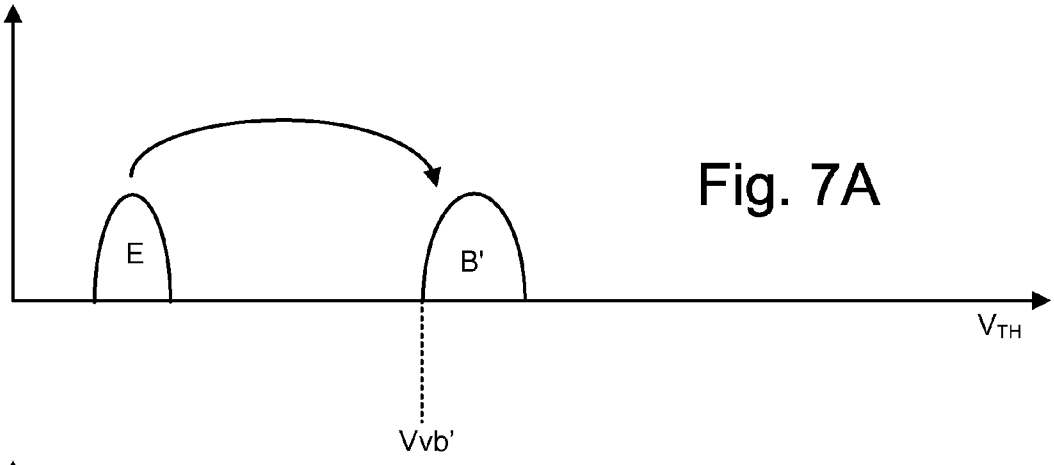
FIGS. 7A-C show various threshold voltage distributions and describe a process for programming non-volatile memory.
Figure 7B:
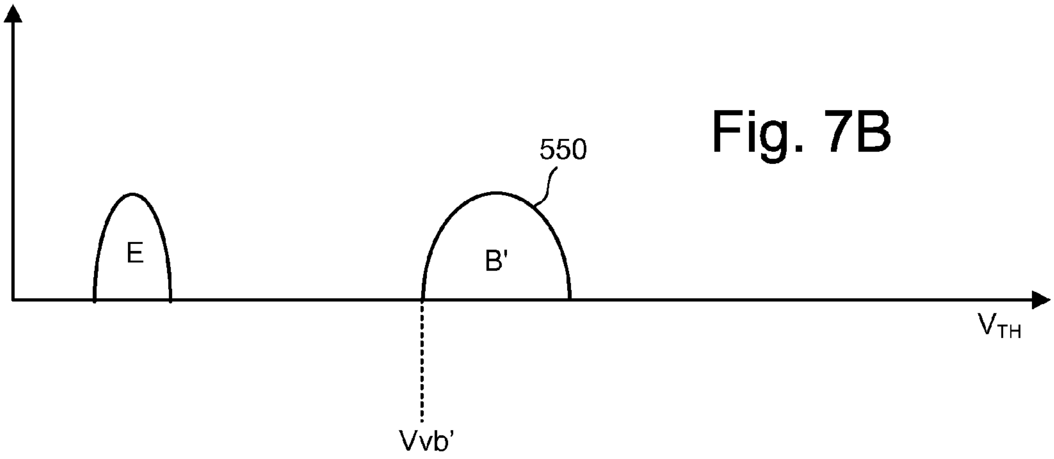
Figure 7C:
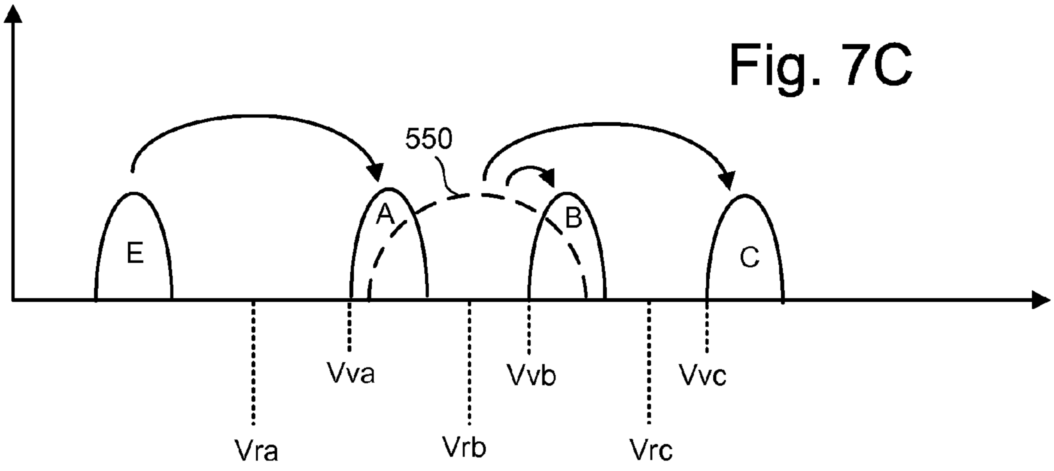

FIGS. 7A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 7A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores data in two pages. For reference purposes these pages of data will be called upper page and lower page; however, they can be given other labels. With reference to state A for the process of FIGS. 7A-C, the upper page stores bit 0 and the lower page stores bit 1. With reference to state B, the upper page stores bit 1 and the lower page stores bit 0. With reference to state C, both pages store bit data 0.

The programming process of FIGS. 7A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 7A therefore shows the programming of memory cells from state E to state B'. State B'depicted in FIG. 7A is an interim state B; therefore, the verify point is depicted as Vvb', which is lower than Vvb.

In one embodiment, after a memory cell is programmed from state E to state B', its neighbor memory cell (connected to WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted in FIG. 7B. This apparent widening of the threshold voltage distribution will be remedied when programming the upper page.

FIG. 7C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 7A-C reduces the effect of coupling between floating gates because only the upper page programming of neighbor memory cells will have an effect on the apparent threshold voltage of a given memory cell.

Although FIGS. 7A-C provide an example with respect to four data states and two pages of data, the concepts taught by FIGS. 7A-C can be applied to other implementations with more or less than four states, different than two pages, and/or other data encodings.

FIG. 8 is a table that describes one embodiment of the order for programming memory cells utilizing the programming method of FIGS. 7A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

In one embodiment, a system can be set up to perform full sequence writing if enough data is written to fill up a word line. If not enough data is being written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Pub. No. 2006/0126390, Ser. No. 11/013,125, filed on Dec. 14, 2004, inventors Sergy Anatolievich Gorobets and Yan Li, incorporated herein by reference in its entirety.

Although FIGS. 6-8 depict the use of four data states to store two bits of data per memory cell, other embodiments could use a different number of data states to store a different (or the same) number of bits of data per memory cell. In one example, eight data states are used to store three bits of data, and the methods discussed herein can be adapted to the eight data states and three bits of data per memory cell.

Figure 9:
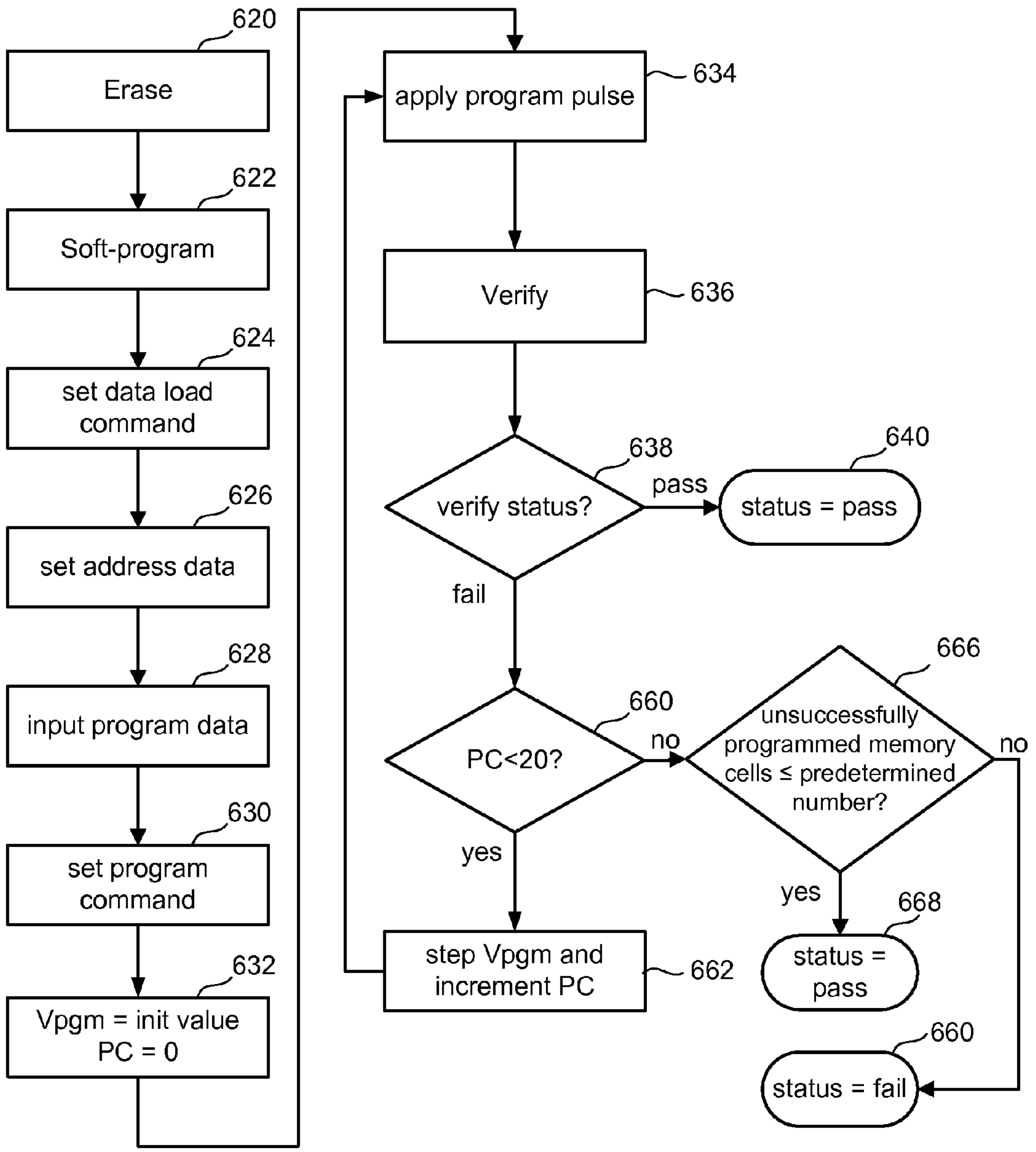
FIG. 9 depicts a flow chart describing one embodiment of a process for programming non-volatile memory.

FIG. 9 is a flow chart describing a programming process for programming memory cells connected to a selected word line. Thus, the process of FIG. 9 is used to implement the full sequence programming of FIG. 6, or one pass (either the first pass or the second pass) of the two pass programming technique of FIGS. 7A-C. In one embodiment, the process of FIG. 9 is performed by and/or at the direction of control circuitry 220 (state machine 222 provides the control and power control 226 provides the appropriate signals). Because a programming process may include programming multiple pages, the programming process may include performing the process of FIG. 9 multiple times.

Note that in some embodiments (but not all), memory cells are programmed from the source side to the drain side. For example, looking at FIG. 5, word line WL0 is programmed first, followed by programming WL1, followed by programming WL2, etc.

In one implementation of the process of FIG. 9, memory cells are erased (in blocks or other units) prior to programming (step 620). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and source are also raised to a significant fraction of the erase voltage. A strong electric field is thus applied to the tunnel oxide layers of selected memory cells and the data of the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, separate blocks, or another unit of cells. After the block of memory cells is erased, the various memory cells can be programmed or partially programmed as described herein. Note that the erasing that is performed in step 620 would not need to be performed before each word line of a block is programmed. Rather, the block can be erased and then each word line can be programmed without subsequent erasing.

In step 622, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells to a tighter threshold voltage distribution. Note that the erasing and soft programming may be performed once for a block prior to each page being programmed.

In step 624, a "data load" command is issued by controller 244 and input to state machine 222. In step 626, address data designating the page address is provided to the decoder circuitry. In step 628, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. In step 630, a "program" command is received from controller 244 and provided to state machine 222.

Triggered by the "program" command, the data latched in step 628 will be programmed into the selected memory cells controlled by state machine 222 using a set of pulses applied to the appropriate word line. In step 632, Vpgm, the programming voltage signal (e.g., the set of pulses) is initialized to the starting magnitude (e.g., 12V or another suitable level) and a program counter PC maintained by state machine 222 is initialized at 0. In step 634, a pulse of the program signal Vpgm is applied to the selected word line.

In step 636, the data states of the selected memory cells are verified using the appropriate set of target levels (e.g., Vva, Vvb, Vvc). If it is detected that the threshold voltage of a selected memory cell has reached the appropriate target level, then the memory cell is locked out of future programming for the remainder of the proves of FIG. 9 by raising its bit line voltage. If all memory cells being programmed have reached their target data states (step 638), the programming process is complete and successful because all selected memory cells were programmed and verified to their target states. A status of "PASS" is reported in step 540. Note that in some implementations of step 638, it is checked whether at least a predetermined number of memory cells have been verified to have reached their target states. This predetermined number can be less than the number of all memory cells, thereby allowing the programming process to stop before all memory cells have reached their appropriate verify levels. The memory cells that are not successfully programmed can be corrected using error correction during the read process.

If, in step 638, it is determined that not all of the memory cells have reached their target states, then the programming process continues. In step 650, the program counter PC is checked against a program limit value. One example of a program limit value is 20; however, other values can be used in various implementations. If the program counter PC is not less than the program limit value, then it is determined in step 656 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 658. In many cases, the memory cells that are not successfully programmed can be corrected using error correction during the read process. If, however, the number of unsuccessfully programmed memory cells is greater than the predetermined number, the program process is flagged as failed and a status of FAIL is reported In step 660. If the program counter PC is less than the program limit value, then the magnitude of the Vpgm pulse is increased by the step size (e.g., 0.2-0.4 volt step size) and the program counter PC is incremented. After step 652, the process loops back to step 634 to apply the next Vpgm pulse.

In general, during verify operations (such as the verify operations performed during step 636 of FIG. 9) and read operations, the selected word line is connected to a voltage, a level of which is specified for each read (e.g., Vra, Vrb or Vrc) and verify (e.g., Vva, Vvb, or Vvb) operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge its corresponding bit line. The voltage on the bit line (or capacitor) is measured after a period of time to see whether it has been discharged or not.

Figure 10:
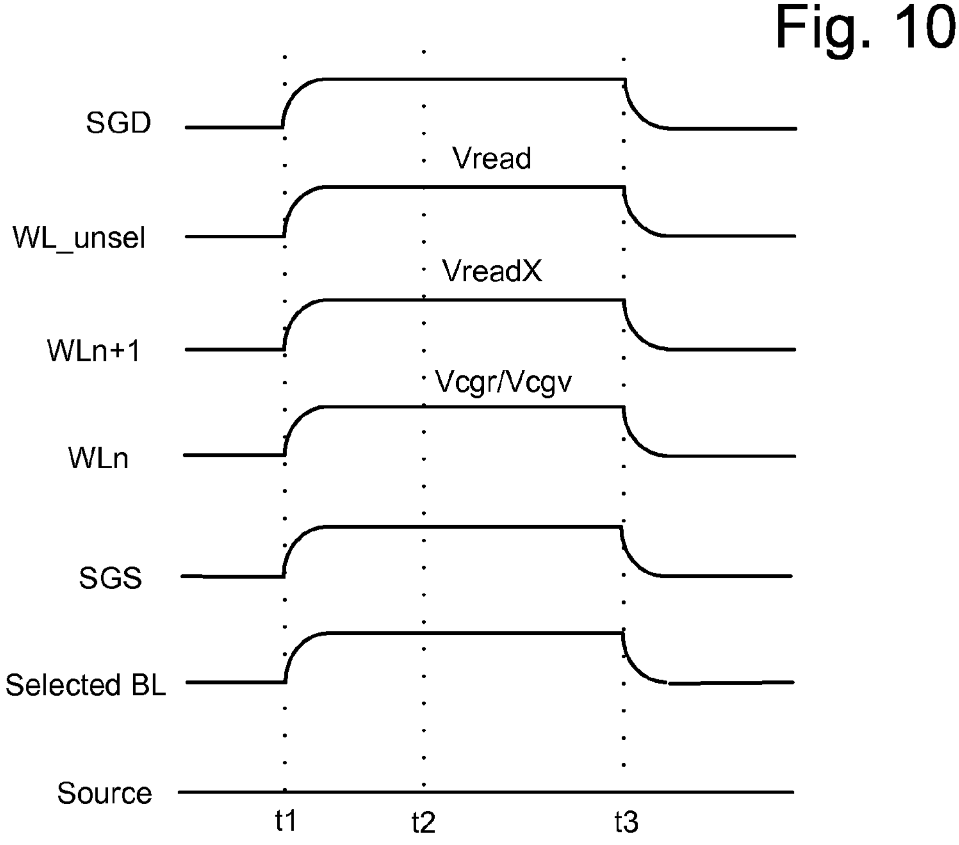
FIG. 10 depicts a timing diagram describing one embodiment of a read operation for non-volatile memory.

FIG. 10 is a timing diagram depicting the behavior of various signals during one iteration of a read or verify process. For example, if the memory cells are binary memory cells, the process of FIG. 10 may be performed once for each memory cell during an iteration of step 636. If the memory cells are multi-state memory cells with four states (e.g., E, A, B, and C), the process of FIG. 10 may be performed three times (e.g., once at Vva, once at Vvb and once at Vvc) for each memory cell during an iteration of step 636.

FIG. 10 shows signals SGD, WL_unsel. WLn+1, WLn, SGS, Selected BL, and Source for a read or verify operation that measures the conduction current of a memory cell by the rate it discharges a dedicated capacitor in a sense amplifier. SGD represents signal provided to the gate of the drain side select gate. SGS is the signal provided to the gate of the source side select gate. WLn is the signal provided to the word line selected/targeted for reading/verification. WLn+1 is the signal provided to the unselected word line that is the drain side neighboring word line to WLn (e.g., WL2 is the drain side neighbor of WL1—see FIG. 5). WL_unsel represents the signal provided to the unselected word lines other than the drain side neighboring word line. The word lines are connected to the control gates of the appropriate memory cells. Selected BL is the bit line selected for reading/verification. Source is the signal provided to the source line for the memory cells (see FIG. 5).

All of the signals start at Vss (approximately 0 volts). At time t1 of FIG. 10, SGD is raised to Vdd (which is a DAC driven parameterized variable), the unselected word lines (WL_unsel) are raised to Vread (which is an overdrive voltage of approximately 5.5 volts that turns on all unselected memory cells), the drain side neighboring word line (WLn+1) is raised to VreadX (another overdrive voltage that is discussed below), the selected word line WLn is raised to Vcgr (e.g., Vra, Vrb, or Vrc of FIG. 11) for a read operation or a Vcgv (e.g., Vva, Vvb, or Vvc of FIG. 11) for a verify operation. In one embodiment, the sense amplifier holds the bit line voltage constant regardless of what the NAND string is doing, so the sense amplifier measures the current flowing with the bit line "clamped" to that voltage. At some point after time t1 and prior to time t3 (as determined by the particular implementation), the sense amplifier will determine whether the capacitor in the sense amplifier has dissipated a sufficient amount. At time t3, the depicted signals will be lowered to Vss (or another value for standby or recovery). Note that in other embodiments, the timing of some of the signals can be changed.

Additional information about the read operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Reading a set of data (e.g., a file, a digital photograph, page of data, block of data, or other unit of data) typically involves performing the read operation of FIG. 10 multiple times. FIG. 11 provides a high level flow chart describing a read process carried out in response to a request to read data. In step 750, a read command is issued by controller 244 and input to state machine 222. In step 752, address data designating the page address is provided to the decoder circuitry. In step 754, one or more read operations (e.g., the read operation of FIG. 10 or a suitable alternative) are performed, as discussed below. The results of the read operations are stored in the appropriate latches 494. The data is reported in step 756. Various embodiments of reporting the data includes transmitting the data from the latches to the state machine, transmitting the data to the controller, transmitting the data to the host, storing the data in an output file, providing the data to a requesting entity, etc.

As discussed above, shifts in the apparent threshold voltage of a floating gate (or other charge storing element) of a non-volatile memory cell can occur because of the coupling of an electric field based on the charge stored in neighboring floating gates (or other neighboring charge storing elements). The problem occurs most pronouncedly between sets of adjacent memory cells that have been programmed at different times. To account for this coupling, the read process for a target memory cell will provide compensation to a neighbor memory cell in order to reduce the coupling effect that the neighbor memory cell has on the particular memory cell. One embodiment also includes setting up, during the verification process, the required conditions for the later application of compensation to the neighbor memory cell. In such an embodiment the overdrive voltage (depicted in FIG. 10 as VreadX) applied to WLn+1 is reduced from a typical value of, for example, 5.5V, down to, for example, 3V. Thus, during a verification process, VreadX is 3 volts (or another suitable value that depends on the implementation). The compensation provided when subsequently reading will consist of application of higher voltage, as compared to that voltage that was applied during the verify phase, to WLn+1 during the read operation performed on WLn. In many prior art devices, all of the unselected word lines would receive Vread. In the embodiment of FIG. 10, all of the unselected word lines, except for the drain side neighbor, receive Vread; while the drain side neighbor receives VreadX. One example of Vread is 5.5 volts; however, other values can be used.

To determine how much compensation should be provided to the neighbor memory cell when reading a target memory cell, the system described herein determines a perceived condition of the memory cell from a set of potential conditions planned for in advance. For example, looking at FIGS. 6 and 7, the system will determined whether the neighbor memory cell is in states E, A, B or C. The use and magnitude of the compensation will be based on which state the neighbor memory cell is in.

One method for testing the condition of the neighbor memory cell when reading a target memory cell is to at least partially temporally intermix the read operations that test the condition of the neighbor memory cell with the read operations that sense the data state of the targeted memory cell. That is, at least partially temporally intermix the read operations for WLn+1 with the read operations for WLn.

Figure 12:
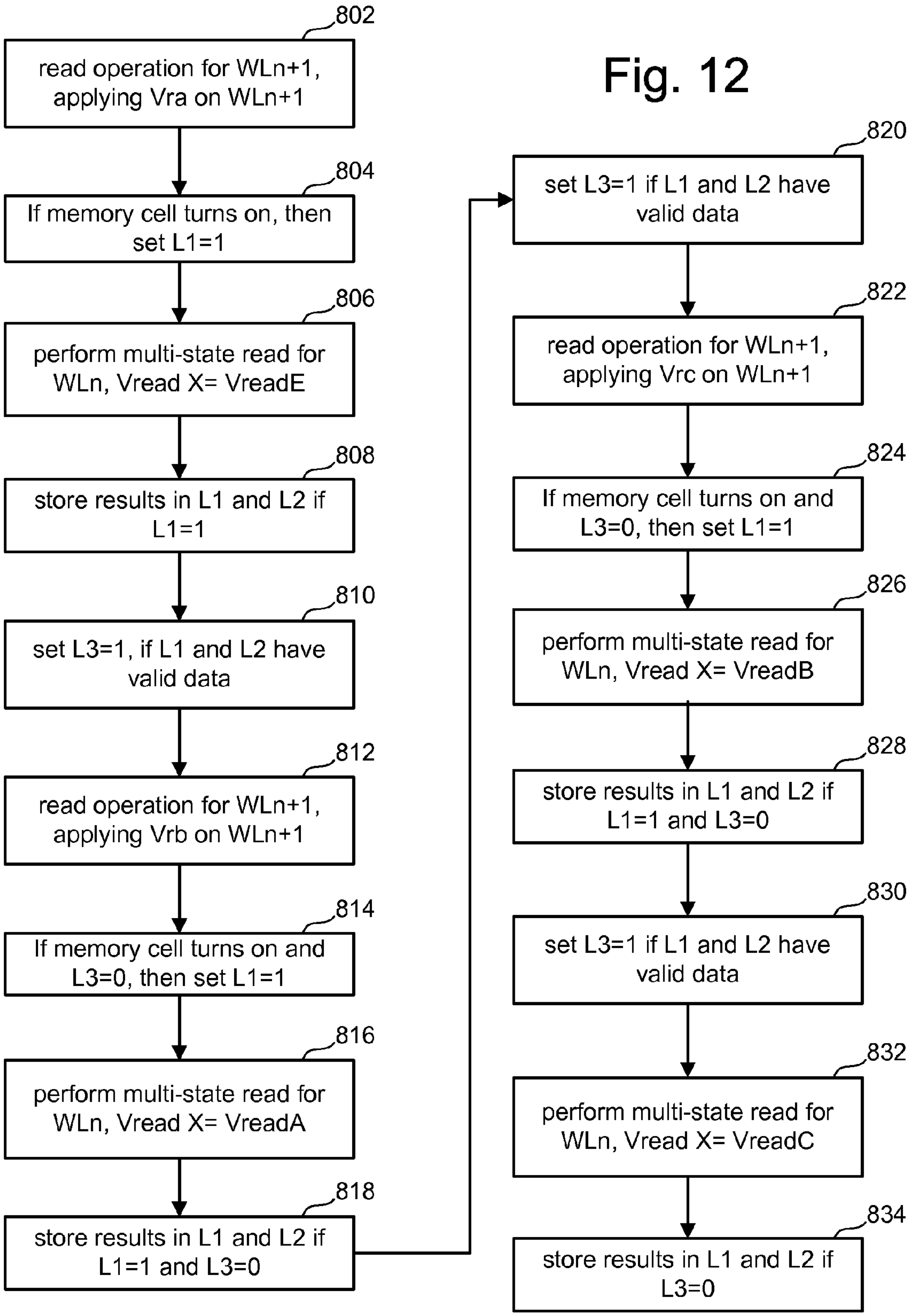
FIG. 12 depicts a flow chart describing one embodiment of a process used when reading non-volatile memory.
Figure 17:
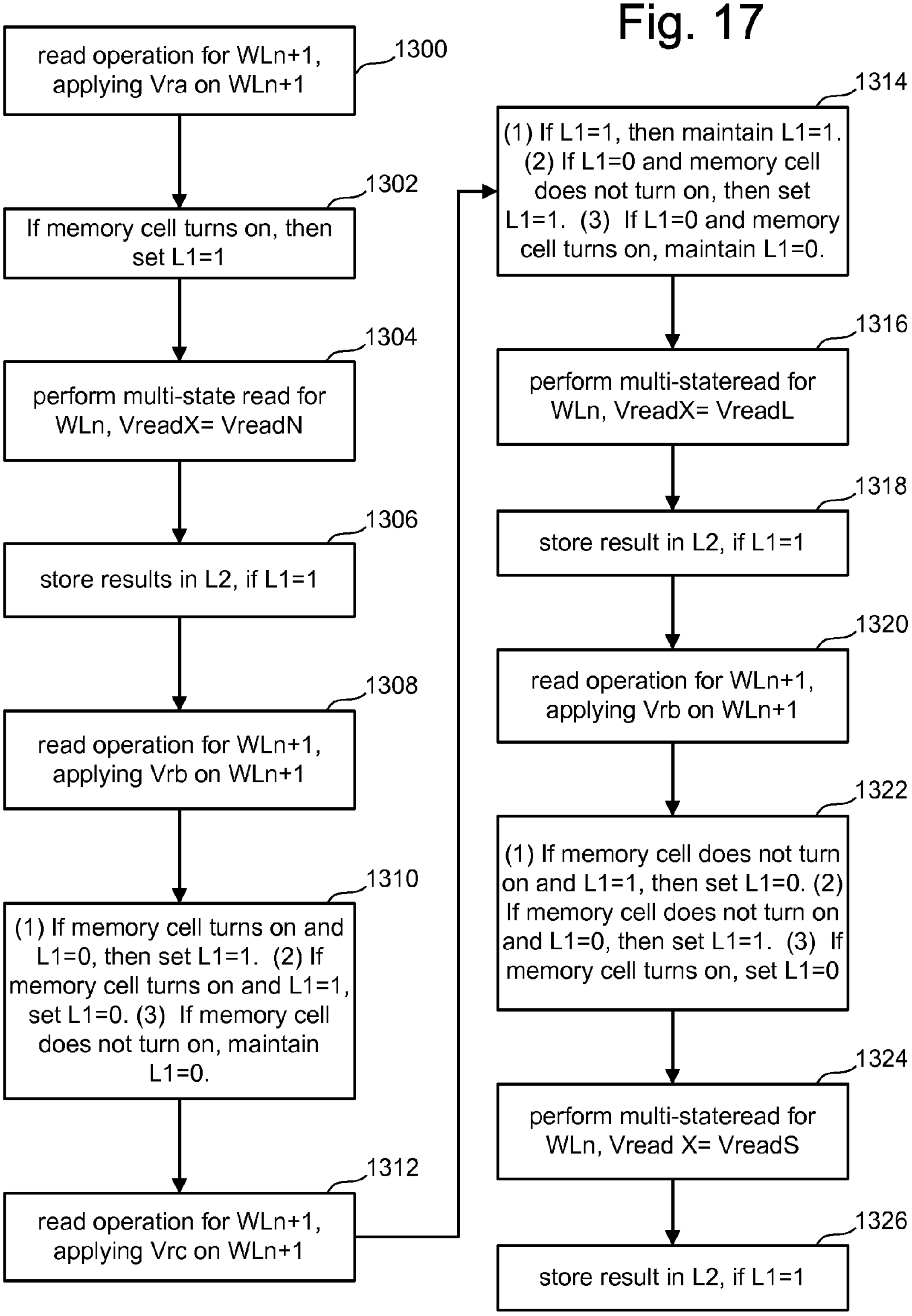
FIG. 17 depicts a flow chart describing one embodiment of a process used when reading non-volatile memory.
Figure 18:
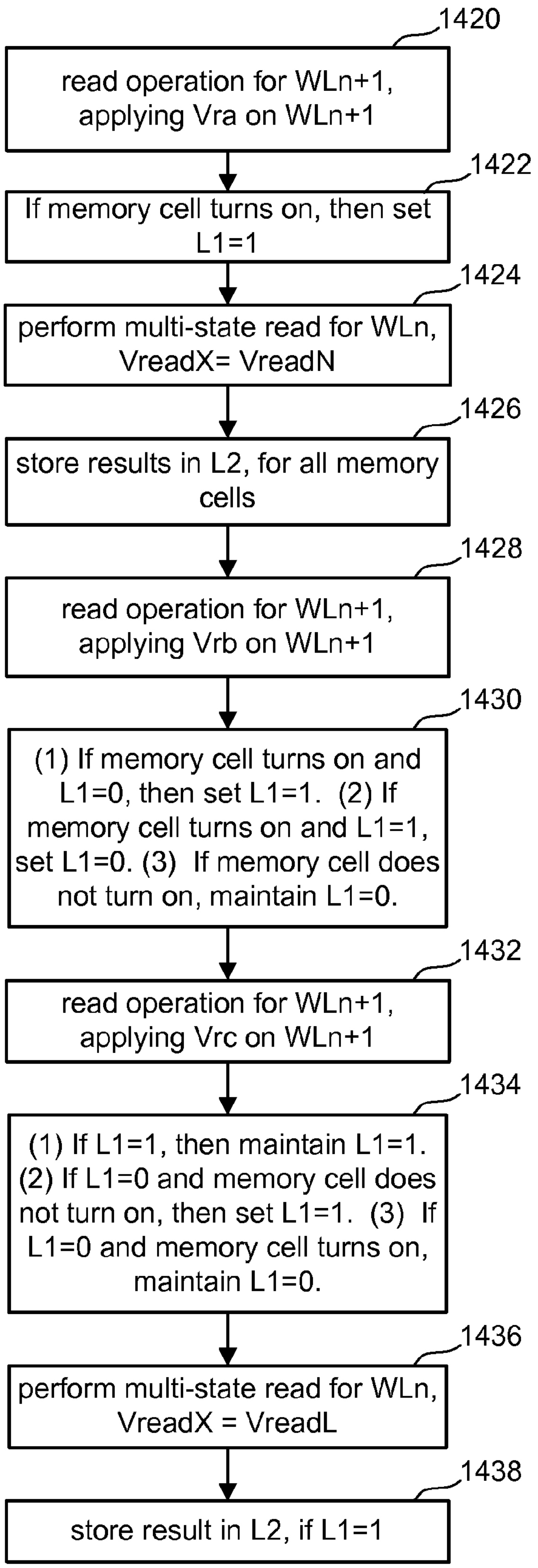
FIG. 18 depicts a flow chart describing one embodiment of a process used when reading non-volatile memory.
Figure 19:
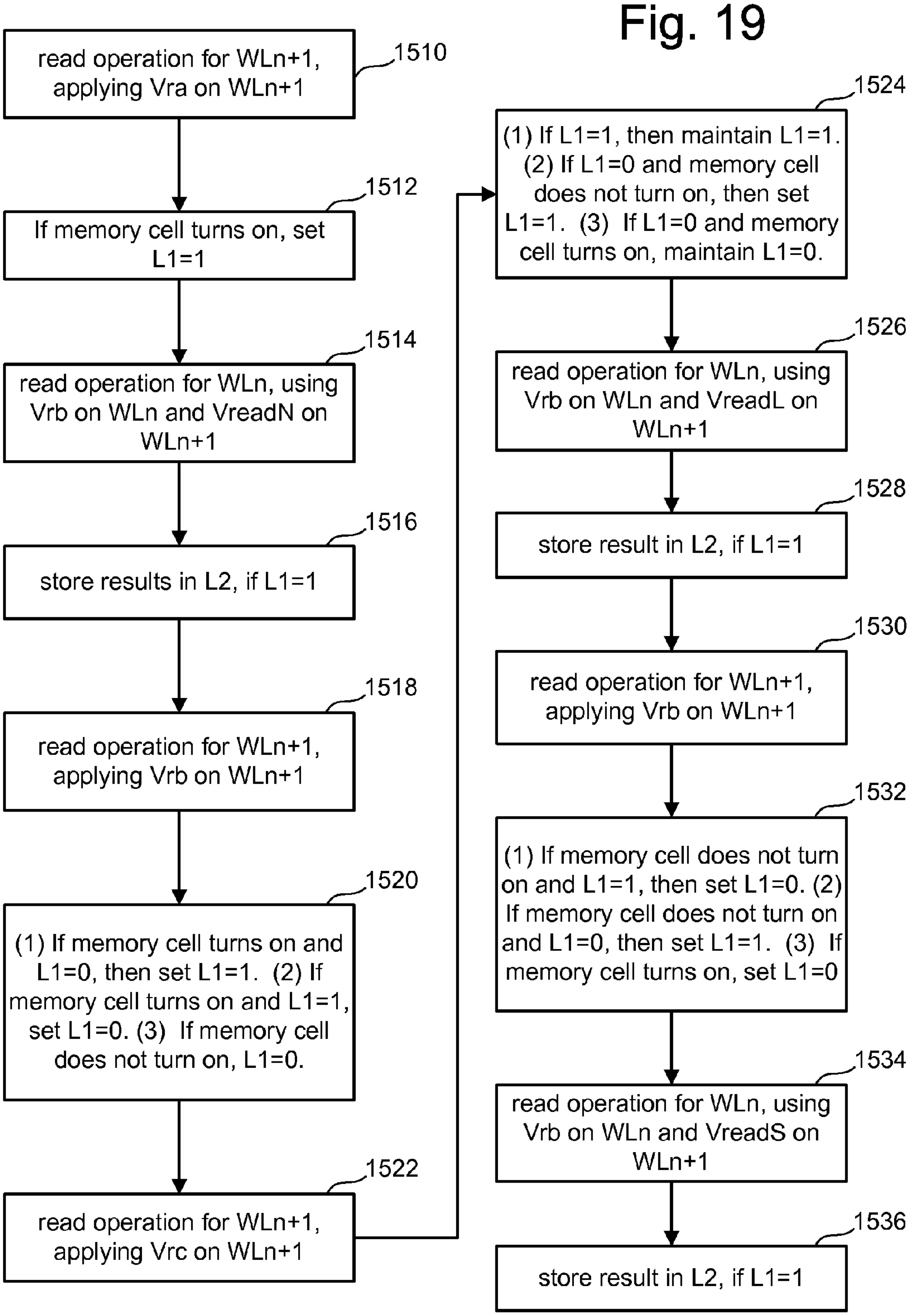
FIG. 19 depicts a flow chart describing one embodiment of a process used when reading non-volatile memory.

FIG. 12 is a flow chart describing one embodiment of a process for reading a page of data that has been programmed according to the process of FIG. 6. The process of FIG. 12 can be used to implement step 754 of FIG. 11. The process of FIG. 12 depicts an example of providing compensation to a neighbor memory cell (based on the perceived condition of that neighbor memory cell) when reading a target memory cell using a scheme that tests the condition of the neighbor memory cell in a manner that at least partially temporally intermixes the read operations that test the condition of the neighbor memory cell with the read operations that sense the data state of the targeted memory cell. The read operations are at least partially intermixed because in some embodiment the read operations can be perfectly alternated, while in other embodiments the alternating can be between groups of read operations or between groups and single read operations. FIGS. 17, 18 and 19 (discussed below) provide additional examples of the at least partially temporally intermixing of the read operations.

The process of FIG. 12 can be implemented as an overall process for reading data that is performed in response to a read request for a particular one or more pages (or other grouping) of data prior to, separate from and/or in conjunction with using ECCs. In other embodiments, the process of FIG. 12 can be performed as part of data recovery step.

In step 802 of FIG. 12, a read operation is performed for word line WLn+1. That is, the process depicted in FIG. 10 is performed for all of the memory cells connected to the WLn+1 (the neighbor to the selected word line WLn that is the focus of the read process of FIG. 12). For example, if the process of FIG. 12 has selected word line WL2 for reading, then in step 802, a read operation will be for the memory cells connected to word line WL3. When performing the process of step 802, the read compare voltage applied to WLn+1 is Vra. Thus, step 802 is a read operation (FIG. 10) to determine whether the memory cells connected to WLn+1 are storing data in state E (See FIG. 6). Vra is applied to WLn+1 as the other word lines receive Vread. The results of the read operation of step 802 are stored in one latch (latches 494) for each bit line (step 804). In one embodiment, each bit line has three latches that are referred to as L1, L2 and L3. The result from step 802 is stored in L1. In other embodiments, the result can be stored in other latches. Thus, in one embodiment, if a memory cell turns on in response to the read operation of step 802, then a "1" is stored in latch L1. In step 806, a multi-state read process is performed for the selected word line WLn. That multi-state read process includes performing three read operations (see FIG. 10), if there are four possible data states. In the first read operation, the read compare point Vcgr is Vra. In the second read operation, the read compare point Vcgr is Vrb. In the third read operation, the read compare point Vcgr is Vrc. During each of the read operations of the multi-state read process of step 806, the drain side neighbor word line WLn+1 receives VreadE and the other unselected word lines received Vread (e.g. 5.5 volts). In one embodiment, VreadE is equal to 3 volts. Since VreadE is equal to the same overdrive voltage used during the verify process, no compensation is being performed. This correlates to data in a neighbor memory cell being in state E (erased state). VreadE provides no compensation for coupling between floating gates. In step 808, results from the multi-state read process of step 806 are stored in latches L1 and L2, if L1 was set in step 804. Thus, in step 808, those memory cells having a neighbor in state E will store the results from the multi-state read process in latches L1 and L2. Because each memory cell stores two bits of data, two single-bit latches are needed to store that data. The results of step 806 will be 11 if the neighbor memory cell is in state E, 10 if the neighbor memory cell is in state A, 00 if the neighbor memory cell is in state B, and 01 if the neighbor memory cell is in state C. If latches L1 and L2 were loaded with valid data in step 808, then latch L3 is set to logic level 1 in step 810 to indicate that latches L1 and L2 have valid data; otherwise, L3 stores logic level 0.

In step 812, a read operation is performed for the memory cells connected to drain side neighbor word line WLn+1, including asserting Vrb (as the compare point) on drain side neighbor word line word line WLn+1. In step 814, if the memory cells turn on, then those memory cells are in states E or A. If a memory cell turned on in step 812 and its corresponding latch L3=0, then the corresponding latch L1 is set to 1. In step 816, a multi-state read process is performed for selected word line WLn, where the drain side neighbor word line WLn+1 receives VreadA. Step 816 is similar to step 806, except that the drain side neighbor word line WLn+1 receives VreadA in step 816 and VreadE in step 806. In one embodiment, VreadA is equal to 4.25 volts. VreadA provides a small amount of compensation for coupling between floating gates. The results from step 816 will be stored in latches L1 and L2, if latch L1 was set to equal 1 in step 814 and latch L3 currently equals 0. In step 820, latch L3 is set to equal 1 if L1 and L2 were loaded with valid data in step 818.

In step 822, a read operation (FIG. 10) is performed for the memory cells connected to drain side neighbor word line WLn+1, including applying Vrc on WLn+1. Step 822 is similar to step 802 except that Vrc is used instead of Vra on WLn+1. In step 824, latches L1 are set to 1 for the corresponding memory cells that turned on in step 822 and have corresponding latch L3 is equal to 0. At step 826, a multi-state read process is performed for WLn, with drain side neighbor word line WLn+1 receiving VreadB. Step 826 is similar to step 806 except that VreadB is used on drain side neighbor word line WLn+1 rather than VreadE. In one embodiment, VreadB is equal to 4.75 volts. VreadB provides a medium amount of compensation for coupling. In step 828, the results from step 826 are stored in latches L1 and L2, if L1 was previously set to equal 1 in step 824 and latch L3 is current storing at 0. In step 830, latch L3 is set to 1, if latches L1 and L2 were loaded with valid data in step 828.

In step 832, a multi-state read process is performed for the memory cells connected to selected word line WLn, with drain side neighbor word line WLn+1 receiving VreadC. Step 832 is similar to step 806 except that step 832 uses VreadC instead of VreadE. In one embodiment, VreadC is equal to 5.5 volts. VreadC provides the most compensation as compared to VreadE, VreadA and VreadB. VreadC provides the appropriate compensation for target memory cells whose neighbor memory cell is in state C. In step 834, the results from step 832 are stored in latches L1 and L2, if latch L3 is equal to 0. Note that all of the read operations performed during the process depicted in FIG. 12 are part of a common attempt to read data stored in the memory cells connected to word line WLn.

Figure 13:
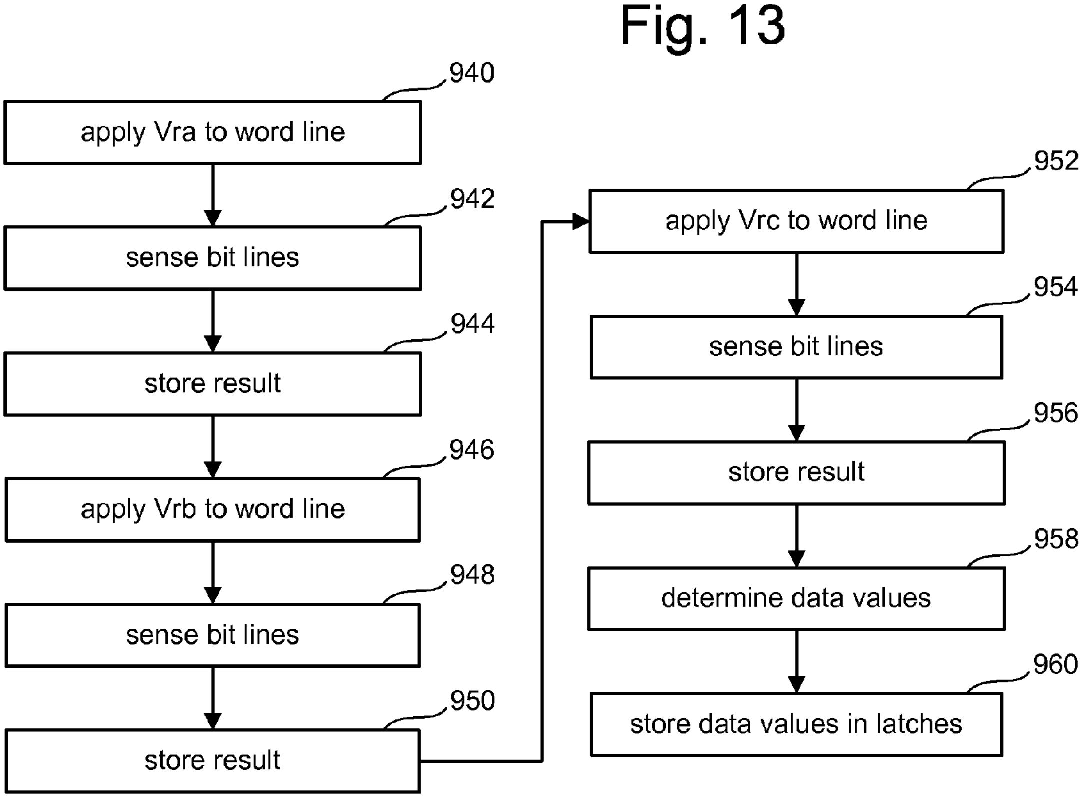
FIG. 13 depicts a flow chart describing one embodiment of a process used when reading non-volatile memory.

FIG. 13 is a flow chart describing the multi-state read process for reading data for a selected word line. This multi-state read process determines the data state (of the possible data states) for the memory cells connected to that selected word line. The process of FIG. 13 is one example implementation of steps 806, 816, 826 and 832 of FIG. 12; however, the overdrive voltage applied to the neighbor word line (WLn+1) is different for each of steps 806, 816, 826 and 832.

In step 940 of FIG. 13, read reference voltage Vra is applied to the selected word line WLn. In step 942, the bit lines associated with the page are sensed (e.g., sensing capacitor in sense amplifier, as mentioned above) to determine whether the addressed memory cells turn on or do not turn on based on the application of Vra to their control gates. Bit lines that conduct indicate that the memory cells were turned on; therefore, the threshold voltages of those memory cells are below Vra (e.g., in state E). In step 944 the result of the sensing for the bit lines is stored in the appropriate latches for those bit lines. Steps 940-944 perform the process described in FIG. 10.

In step 946, read reference voltage Vrb is applied to the selected word line WLn. In step 948, the bit lines are sensed as described above. In step 950, the results are stored in the appropriate latches for the bit lines. Steps 946-950 perform the process described in FIG. 10.

In step 952, read reference voltage Vrc is applied to the selected word line WLn. In step 954, the bit lines are sensed to determine which memory cells turn on, as described above. In step 956, the results from the sensing step are stored in the appropriate latches for the bit lines. Steps 940-944 perform the process described in FIG. 10.

In step 958, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 492 at the end of the process. In another embodiment, processor 492 determines the data values on the fly, such that as each sensing operation is performed the data analysis is updated. In step 960, processor 492 will store the determined data values in the appropriate latches for each bit line. In other embodiments, sensing the various levels (Vra, Vrb, and Vrc) may occur in different orders.

The process of FIG. 13 performs three read operations (see FIG. 10). The first read operation (steps 940-944) applies Vra to WLn, VreadX to WLn+1, and Vread to the other unselected word lines. The second read operation (steps 946-950) applies Vrb to WLn, VreadX to WLn+1, and Vread to the other unselected word lines. The third read operation (steps 952-9956) applies Vrc to WLn, VreadX to WLn+1, and Vread to the other unselected word lines. The value of VreadX can change for different iterations of the process of FIG. 13. For example, when the process of FIG. 13 is performed during step 806 of FIG. 12, VreadX=VreadE. When the process of FIG. 13 is performed during step 816 of FIG. 12, VreadX=VreadA. When the process of FIG. 13 is performed during step 826 of FIG. 12, VreadX=VreadB. When the process of FIG. 13 is performed during step 832 of FIG. 12, VreadX=VreadC.

FIGS. 14-20 describe processes used to read data that is programmed according to the method associated with FIGS. 7A-C. The process of FIG. 14 can be implemented as an overall process for reading data that is performed in response to a read request for a particular one or more pages (or other grouping) of data prior to, separate from and/or in conjunction with using ECCs. In other embodiments, the process of FIG. 14 can be performed as part of data recovery step.

When reading data as programmed according to the process of FIGS. 7A-C, any perturbation from floating gate to floating gate coupling due to programming the lower page of neighboring memory cells should be corrected when programming the upper page of the memory cell under question. Therefore, when attempting to compensate for the floating gate to floating gate coupling effect from neighboring cells, one embodiment of the process need only consider the coupling effect due to the programming of the upper page of neighboring memory cells. Thus, in step 1060 of FIG. 14, the process determines whether neighboring word line has been programmed with upper page data. If the upper page of the neighboring word line was not programmed (step 1062), then the page under consideration can be read without compensating for the floating gate to floating gate coupling effect (step 1064). If the upper page of the neighboring word line was programmed (step 1062), then the page under consideration should be read with potentially using some compensation for the floating gate to floating gate coupling effect in step 1066.

In one embodiment, a memory array implementing the programming process of FIGS. 7A-C will reserve a set of memory cells to store one or more flags. For example, one column of memory cells can be used to store flags indicating whether the upper page for the respective rows of memory cells has been programmed. In some embodiments, redundant cells can be used to store copies of the flag. By checking the appropriate flag, it can be determined whether the upper page for the neighboring word line has been programmed.

In one embodiment, the memory cell storing the flag will store data in state E if the flag is not set and in state C if the flag is set. Therefore, when that particular memory cell is sensed, if the memory cell conducts (turns on) in response to Vrc being applied to its control gate, then the memory cell is not storing data in state C and the flag is not set. If the memory cell does not conduct in response to Vrc, then it is assumed that the memory cell is indicating that the upper page has been programmed. Thus, in one embodiment, step 1060 will include checking to see if the flag is set by performing a read operation (see FIG. 10) that uses Vrc as the read compare point for WLn+1.

In another embodiment, the flag can be stored in a byte. Rather than storing all bits in state C, the byte will include a unique 8-bit code representing the flag and known to the state machine 222, such that the 8-bit code has at least one bit in state E, at least one bit in state A, at least one bit in state B and at least one bit in state C. If the upper page has not been programmed, the byte of memory cells will all be in state E. If the upper page has been programmed, then the byte of memory cells will store the code. In one embodiment, the flag can be checked by determining whether any of the memory cells of the byte storing the code do not turn on in response to Vrc. In another embodiment, the byte of memory cells storing the flag is sensed and sent to the state machine, which will verify whether the code stored in the memory cells matches the code expected by the state machine. If so, the state machine concludes that the upper page has been programmed.

More details about such a flag and the process for programming can be found in U.S. Pat. No. 6,657,891, Shibata et al., "Semiconductor Memory Device For Storing Multi-Valued Data," incorporated herein by reference in its entirety.

Figure 14:
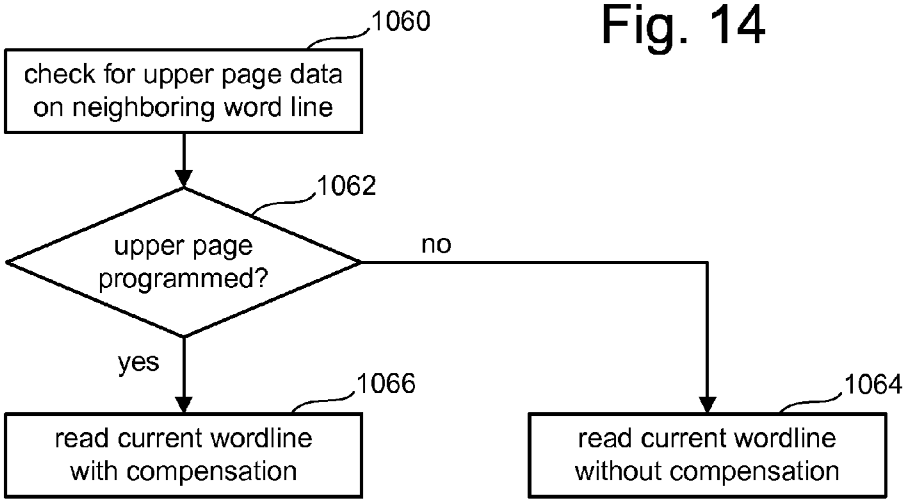
FIG. 14 depicts a flow chart describing one embodiment of a process used when reading non-volatile memory.
Figure 15:
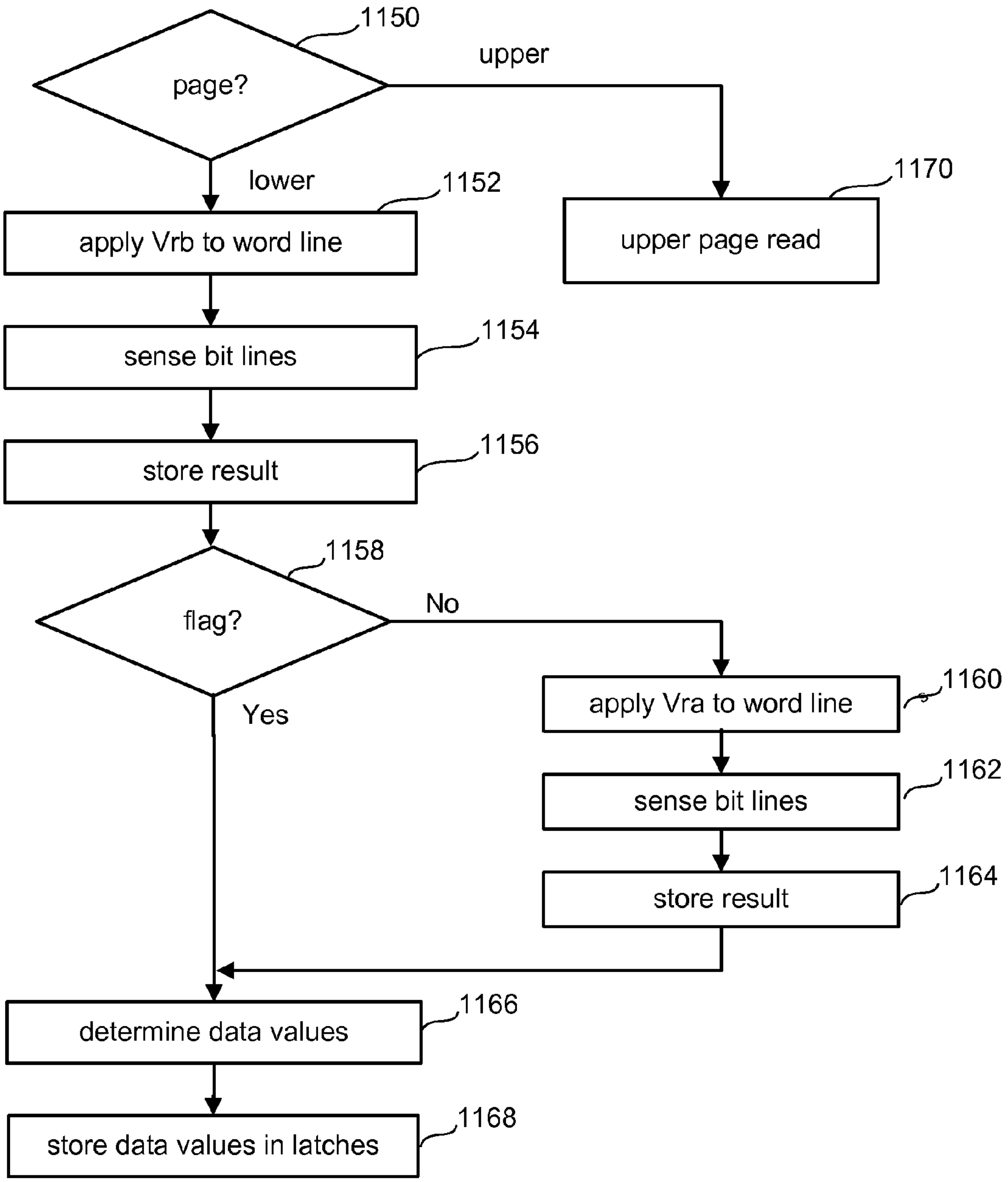
FIG. 15 depicts a flow chart describing one embodiment of a process used when reading non-volatile memory.

FIG. 15 is a flow chart describing one embodiment of a process for reading data of the word line under consideration when the system does not need to compensate for floating gate to floating gate coupling from a neighboring word line (see step 1064 of FIG. 14). In step 1150, it is determined whether the read is for the upper page or lower page associated with the word line under consideration—WLn. If the read is for the lower page, then in step 1152 voltage Vrb is applied to the selected word line WLn associated with the page being read. In step 1154, the bit lines are sensed (as discussed above). In step 1156, the results of sensing step 1154 are stored in the appropriate latches. Steps 1152-1156 implement the read operation of FIG. 10.

In step 1158, the flag is checked to determine if the page contains upper page data. If there is no flag, then any data present will be in the intermediate state (e.g., state 550), Vrb was the incorrect comparison voltage to use, and the process continues at step 1160. In step 1160, Vra is applied to the word line, the bit lines are re-sensed at step 1162, and in step 1164 the result is stored. Steps 1160-1164 implement the read operation of FIG. 10.

In step 1166 (after either step 1164, or step 1158 if the flag is set), processor 492 determines a data value to be stored. In one embodiment, when reading the lower page, if the memory cell turns on in response to Vrb (or Vra—depending on step 1158) being applied to the word line, then the lower page data is "1"; otherwise, the lower page data is "0". If it is determined that the page address corresponds to the upper page (step 1150 of FIG. 15), then an upper page read process is performed at step 1170. In one embodiment, the process of FIG. 15 includes the application of VreadE to the drain side neighboring word line during read operations (see FIG. 10, VreadX=VreadE).

Figure 16:
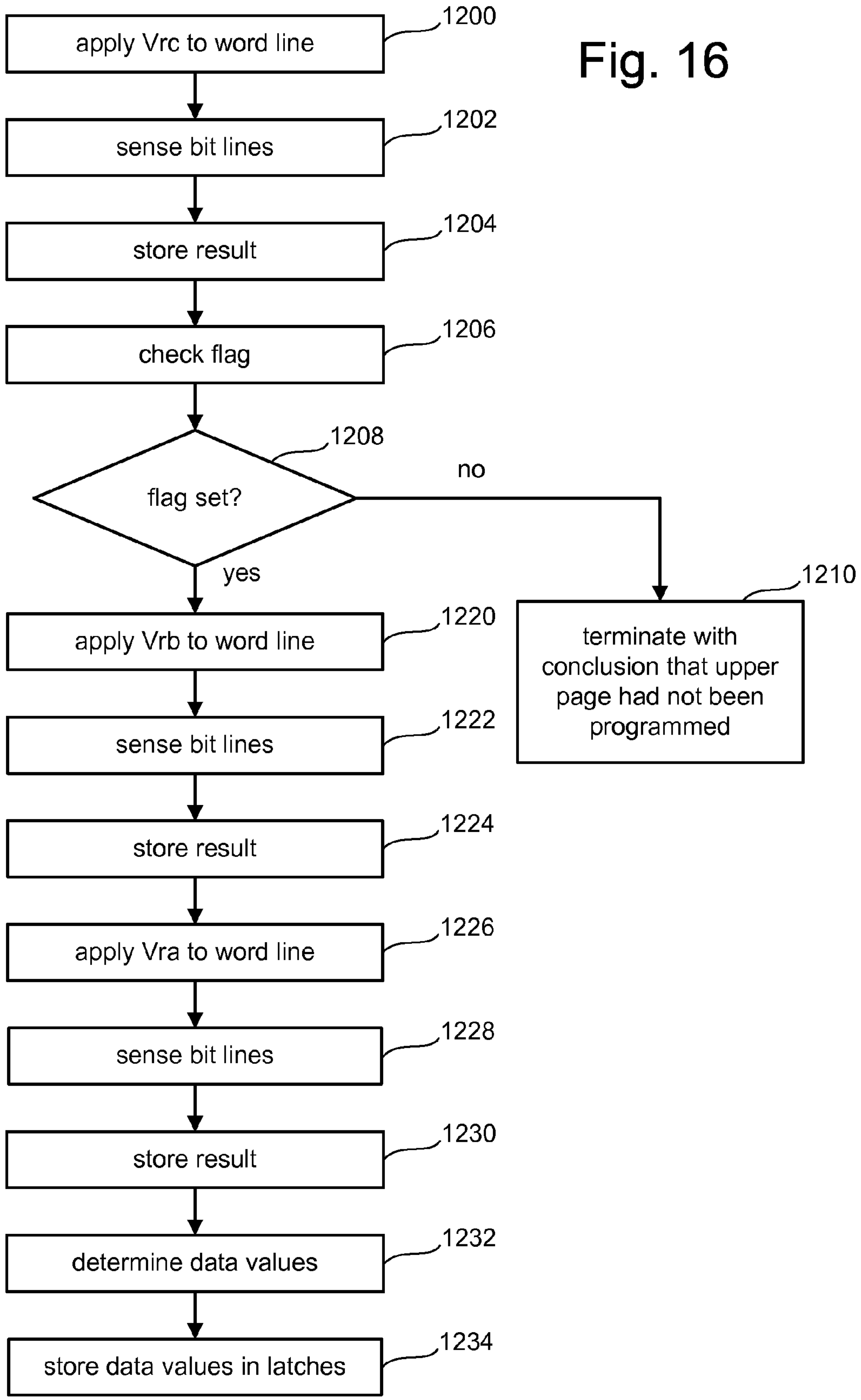
FIG. 16 depicts a flow chart describing one embodiment of a process used when reading non-volatile memory.

FIG. 16 is a flow chart describing one embodiment for performing an upper page read process without using compensation (step 1170 of FIG. 15). In step 1200, read reference voltage Vrc is applied to the selected word line associated with the page being read. At step 1202, the bit lines are sensed as described above. In step 1204, the results of step 1202 are stored in the appropriate latches. Steps 1200-1204 implement the read operation of FIG. 10. In step 1206, the system checks the flag indicating upper page programming associated with the page being read. As described above, one embodiment of step 1206 is performed by checking whether any of the memory cells of the byte storing the code do not turn on in response to Vrc. If the flag has not been set (step 1208), then the process of FIG. 16 terminates with the conclusion that the upper page has not been programmed.

If the flag has been set (step 1208), then it is assumed that the upper page has been programmed and voltage Vrb is applied to the selected word line associated with the page being read in step 1220. In step 1222, the bit lines are sensed as discussed above. In step 1224, the results of step 1222 are stored in the appropriate latches. Steps 1220-1224 implement the read operation of FIG. 10.

In step 1226, voltage Vra is applied to the word line associated with the page being read. In step 1228, the bit lines are sensed. In step 1230, the results of step 1228 are stored in the appropriate latches. Steps 1226-1230 implement the read operation of FIG. 10.

In step 1232, processor 222 determines the data value stored by each of the memory cells being read based on the results of the three sensing steps 1202, 1222 and 1228. At step 1234, the data values determined in step 1232 are stored in the appropriate data latches for eventual communication to the host/user. In one embodiment, the process of FIG. 16 includes the application of VreadE to the drain side neighboring word line during the read operations.

Looking back at FIG. 14, if the upper page of the drain side neighbor word line was programmed (see step 1062), then the currently selected word line is read with compensation in step 1066. If upper page data is being read as part of step 1066, then the process of FIG. 17 is performed. If lower page data is being read, then the process of FIG. 19 is performed.

In step 1300 of FIG. 17, a read operation (FIG. 10) for the memory cells connected to the drain side neighbor word line WLn+1 is performed with applying Vra to the drain side neighbor word line WLn+1. If the memory cells turn on, then corresponding latches L1 are set to equal 1. That is, the process of FIG. 10 is performed for all of the memory cells (or a subset of memory cells) connected to word line WLn+1. Each of those memory cells has a corresponding set of latches (L1, L2, and L3). For each of the memory cells subjected to the read operation in step 1300, the corresponding latch L1 is set to equal 1 in step 1302 if that memory cell is in state E. In step 1304, a multi-state read process (see FIG. 13) is performed. During that multi-state read process, the drain side neighbor word line WLn+1 will receive VreadN in each of the read operations (VreadX=VreadN). In one embodiment, VreadN equals 4.5 volts. In one embodiment, when programming according to the process of FIGS. 7A-C, verification is performed using VreadX=4.5 volts. Memory cells who have a neighbor in state E do not need to be compensated; therefore, no compensation is provided by using VreadN as the overdrive voltage used during verification. In step 1306, the results of the multi-state read process of 1304 are stored in latch L2 if latch L1 was set to equal 1.

In step 1308, a read operation (see FIG. 10) is performed for the memory cells connected to the drain side neighbor word line WLn+1, with Vrb being applied to the drain side neighbor WLn+1. In step 1310, each latch L1 is set to equal 1 if the corresponding memory cell turned on during the process of step 1308 and L1 is currently equal to 0. If the memory cell turned on and L1 is already equal to 1 before step 1310, then reset L1 equal to 0. If the memory cell did not turn on, then maintain L1 at 0. Therefore, at the end of step 1310, L1 will be equal to 1 for memory cells whose neighbor is set in state A. A memory cell and its neighbor on the same bit line will share the same latches L1, L2 and L3.

In step 1312, a read operation (FIG. 10) is performed for the drain side neighbor word line WLn+1, with read compare voltage Vrc being applied to the drain side neighbor word line WLn+1. In step 1314, if latch L1 has already been set to 1, then maintain that latch as data 1. If latch L1 currently equals 0 and the corresponding memory cell did not turn on, then set latch L1 to equal 1. If latch L1 is equal to 0 and the corresponding memory cell turned on, then maintain latch L1 equal to 0. At the end of step 1314, latch L1 will be equal to 1 if the drain side neighbor memory cell is in state A or state C. In step 1316, a multi-state read process (FIG. 13) is performed for the selected word line WLn. During that multi-state read process, the drain side neighbor word line WLn+1 receives Vreadx=VreadL for each of the read operations. In one embodiment, VreadL is 6.0 volts. Thus, those memory cells whose neighbor memory cells are in state A or C will receive the larger compensation associated with the overdrive voltage of 4.375 volts. The results of the multi-state read process of step 1316 are stored in latch L2, if latch L1 was set to equal 1.

In step 1320, a read operation (see FIG. 10) is performed for the memory cells connected to drain side neighbor word line WLn+1, including asserting read compare value Vrb on drain side neighbor word line WLn+1. In step 1322, if the corresponding memory cell did not turn on in step 1320 and latch L1 has already been set to equal 1, then reset latch L1 to equal 0. If the memory cell did not turn on in step 1320 and the latch L1 was at 0, then set latch L1 to equal 1. If the memory cell turned on, then set L1 to equal 0. Therefore, at the end of step 1322, latch L1 will equal 1 for those memory cells who are in state B. In step 1324, a multi-state read process (FIG. 13) is performed for the selected word line WLn where the drain side neighbor word line WLn+1 receives VreadS (VreadX=VreadS). In one embodiment, VreadS equals 5.0 volts. This corresponds to a small amount of compensation. In step 1326, the results from the multi-state read process of step 1324 are stored in latch L2 for those memory cells whose latch L1 is equal to 1. Note that all of the read operations performed in the process depicted in FIG. 17 are part of a common attempt to read upper page data stored in the memory cells on word line WLn.

Looking back at FIGS. 7A-7C, floating gate to floating gate coupling can occur from programming the upper page of a neighbor from state E to state A or from the intermediate state 550 to state C. This floating gate coupling is compensated for using VreadL. If the neighbor memory cell is in state E, there is no coupling that needs to be compensated for. A memory cell whose upper page programming changed that cell from the intermediate state 550 to state B only changed the threshold voltage a smaller amount and, therefore, only a smaller amount of coupling needs to be compensated for using VreadS.

FIG. 18 is a flowchart of a process that is another embodiment for performing upper page read using compensation. One difference between the process of FIG. 18 and the process of FIG. 17 is that the process of FIG. 17 compensated memory cells whose neighbor was in state B and the process of FIG. 18 does not provide compensation for memory cells whose neighbor is in state B. In step 1420, a read operation (see FIG. 10) is performed for the memory cells connected to drain side neighbor word line WLn+1, with applying Vra to drain side neighbor word line WLn+1. If a memory cell turns on, then the corresponding latch for the associated memory cell is set to equal 1. Thus, for all of the memory cells connected to WLn+1 who are in state E, the corresponding latches for those bit lines will be set to equal 1. In step 1424, a multi-state read process (FIG. 13) is performed for the selected word line WLn. During that multi-state read process, drain side neighbor word line WLn+1 receives VreadN (no compensation). In step 1426, the results of the multi-state read process of step 1424 is stored in each latch L2 for the memory cells. Note that step 1424 includes performing the process of FIG. 16, where VreadX=VreadN.

In step 1428, a read operation (FIG. 10) is performed for the memory cells connected to drain side neighbor word line WLn+1, with applying Vrb to drain side neighbor word line WLn+1. In step 1430, if the memory cells turn on in response to step 1428 and latch L1 is at 0, then set corresponding latch L1 to equal 1. If the memory cell turns on and latch L1 was already set to 1, then reset corresponding latch L1 to equal 0. If the memory cell does not turn on, then maintain latch L1 to equal 0. Therefore, after step 1430, latch L1 will equal 1 for those memory cells who were in state A. In step 1432, a read operation (FIG. 10) is performed for the memory cells connected to the drain side neighbor word line WLn+1, with applying Vrc to drain side neighbor word line WLn+1. In step 1434, if latch L1 is equal to 1, then maintain latch L1 being equal to 1. If latch L1 equals 0 and the corresponding memory cell did not turn on, then set latch L1 to equal 1. If latch L1 is equal to 0 and the corresponding memory cell did not turn on, then maintain latch L1 to equal 1. After step 1434, those memory cells in states A or C will have their latch L1 set to equal 0. In step 1436, a multi-state read process (FIG. 13) is performed for the selected word line WLn with drain side neighbor word line WLn+1 receiving VreadL. Step 1436 includes performing the process of FIG. 13, with VreadX=VreadL. In step 1438, results of step 1436 are stored in latch L2, if latch L1 was set to 1. Therefore, the data that was already in L2 is being overwritten for those memory cells in states A and C. The process of FIG. 18, therefore, will provided no compensation for memory cells whose neighbor memory cell has upper page data in states E and B, and perform some compensation for memory cells whose neighbor is in states A or C. Note that all of the read operations performed in the process depicted in FIG. 18 are part of a common attempt to read upper page data stored in the memory cells on word line WLn.

The process of FIG. 19 is used to read data from the lower page while providing compensation for floating gate to floating gate coupling. In step 1510 of FIG. 19, a read operation (FIG. 10) is performed for the drain side neighbor word line WLn+1, with Vra being applied to the drain side neighbor word line WLn+1. If the memory cell turns on in response to the read operation of step 1510, then latch L1 is set to equal 1 in step 1512. In step 1514, a read operation (FIG. 10) is performed for the memory cells connected to the selected word line WLn. The read operation of step 1514 includes applying Vrb to selected word line WLn, applying VreadN on neighbor word line WLn+1, and applying Vread to the other unselected word lines. Thus, Vcgr=Vrb and VreadX=VreadN. In step 1516, results of step 1514 are stored in latch L2, if latch L1 has been set to equal 1.

In step 1518, a read operation (FIG. 10) is performed for the memory cells connected to drain side neighbor word line WLn+1, with Vrb being applied to drain side neighbor word line WLn+1. In step 1520, if a memory cell turned on in response to step 1518 and its corresponding latch L1 has been storing data 0, then set that corresponding latch L1 to equal 1. If the memory cell turned on in response to step 1518 and latch L1 was equal to 1 then reset that latch L1 to equal 0. If a memory cell does not turn on in response to step 1518, then maintain latch L1 at 0. At the end of step 1520, latch L1 will equal 1 for memory cells whose drain side neighbor is in state A. In step 1522, a read operation (FIG. 10) is performed for memory cells connected to drain side neighbor word line WLn+1, including applying Vrc to drain side neighbor word line WLn+1. In step 1524, if a latch L1 is already set to equal 1, then maintain L1 equal to 1. If latch L1 is storing 0 and the corresponding memory cell does not turn on, then set L1 to equal 1. If L1 equals 0 and the corresponding memory cell turns on, then maintain L1 equal to 0. At the end of step 1524, latch L1 is equal to 0 for those memory cells in states A and C. In step 1526, a read operation (FIG. 10) is performed for selected word line WLn. The read operation of step 1526 includes applying Vrb to WLn (Vcgr=Vrb) and applying VreadL (large compensation) to WLn+1 (VreadX=VreadL). In step 1528, the results from step 1526 are stored in latch L2 (if the memory cell turned on in response to Vrb, a data 1 is stored in latch L2) if latch L1 has been set to 1.

In step 1530, a read operation (FIG. 10) is performed for memory cells connected to drain side neighbor word line WLn+1, with applying Vrb to drain side neighbor word line WLn+1. In step 1532, if a memory cell does not turn on in response to step 1530 and its corresponding L1 has already been set to 1, then reset L1 to equal 0. If the memory cell does not turn on and L1 has been equal to 0, then set L1 equal to 1. If the memory turns on in response to step 1530, then set L1 equal to 0. At the end of step 1532, latch L1 will be equal to 1 for those memory cells whose drain side memory cell is in state B. In step 1534, a read operation (FIG. 10) is performed for memory cells connected to the selected word line WLn. During the read operation of step 1534, read compare Vrb is applied to selected word line WLn (Vcgr=Vrb) and VreadS (small compensation) is applied to drain side neighbor word line WLn+1 (VreadX=VreadS). In step 1536, the results from step 1534 are stored in latch L2, if latch L1 is currently set to equal 1. The process of FIG. 19 performs a larger compensation if a neighbor memory cell is in states A or C, and a small compensation if the neighbor memory cell is in state B.

In an alternative embodiment of FIG. 19, compensation can be performed if a neighbor memory cell is in states A and C and no compensation will be performed if the neighbor memory cell is in states E or B. In this alternative embodiment, step 1516 can store data for all memory cells, step 1528 will overwrite data for the memory cells who at that point have their latch L1 storing data equal to 1, and steps 1530-1536 can be skipped. Note that all of the read operations performed as part of the process depicted in FIG. 19 are part of a common attempt to read lower page data stored in the memory cells on word line WLn.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:

a set of non-volatile storage elements including a target non-volatile storage element and a neighbor non-volatile storage element, the neighbor non-volatile storage element is next to the target non-volatile storage element; and one or more managing circuits in communication with the set of non-volatile storage elements, as part of an attempt to read data from the target non-volatile storage element the one or more managing circuits perform a set of read operations on the target non-volatile storage element and performs a group of read operations on the neighbor non-volatile storage element, one or more of the group of read operations are temporally intermixed with at least a portion of the set of read operations, the set of read operations include applying different voltages to the neighbor non-volatile storage element, the one or more managing circuits choose a subset of the set of read operations based on the group of read operations and identifies the data stored in the target non-volatile storage element based on the chosen subset.

2. A non-volatile storage system according to claim 1, wherein:

each of the different voltages is associated with a different condition of the neighbor non-volatile storage element.

3. A non-volatile storage system according to claim 1, wherein:

the set of read operations includes a first subset of read operations and a second subset of read operations;

the first subset of read operations includes multiple read operations that apply a first voltage to the neighbor non-volatile storage element; and the second subset of read operations includes multiple read operations that apply a second voltage to the neighbor non-volatile storage element.

4. A non-volatile storage system according to claim 1, wherein:

the target non-volatile storage element and the neighbor non-volatile storage element are part of a NAND string that includes other non-volatile storage elements;

at least one read operation of the set of read operations applies a read compare voltage to the target non-volatile storage element, a first voltage to the neighbor non-volatile storage element and an other voltage to the other non-volatile storage elements;

at least another read operation of the set of read operations applies the read compare voltage to the target non-volatile storage element, a second voltage to the neighbor non-volatile storage element and the other voltage to the other non-volatile storage elements; and the other voltage is different than the first voltage.

5. A non-volatile storage system according to claim 1, further comprising:

a set of latches shared by the target non-volatile storage element and the neighbor non-volatile storage element, the one or more managing circuits choose the subset of the set of read operations by storing data in one of the latches for the subset because the subset is associated with a particular condition of the neighbor non-volatile storage element, the group of read operations identifies the particular condition.

6. A non-volatile storage system according to claim 1, wherein:

the one or more managing circuits identify data by providing the data to a host that is in communication with the non-volatile storage system.

7. A non-volatile storage system according to claim 1, wherein:

the group of read operations includes testing for a first condition of the neighbor non-volatile storage element, testing for a second condition of the neighbor non-volatile storage element and testing for a third condition of the neighbor non-volatile storage element;

the set of read operations includes a first subset of read operations, a second subset of read operations, a third subset of read operations and a fourth subset of read operations;

the first subset of read operations includes multiple read operations that apply a first voltage to the neighbor non-volatile storage element, the first voltage is associated with the first condition;

the second subset of read operations includes multiple read operations that apply a second voltage to the neighbor non-volatile storage element, the second voltage is associated with the second condition but not the first condition;

the third subset of read operations includes multiple read operations that apply a third voltage to the neighbor non-volatile storage element, the third voltage is associated with the third condition;

the fourth subset of read operations includes multiple read operations that apply a fourth voltage to the neighbor non-volatile storage element;

the one or more managing circuits perform the first subset of read operations after the testing for the first condition and prior to the testing for the second condition;

the one or more managing circuits perform the second subset of read operations after the testing for the second condition and prior to the testing for the third condition; and the one or more managing circuits perform the third subset of read operations after the testing for the third condition.

8. A non-volatile storage system according to claim 1, further comprising:

a set of latches including a first one bit latch, a second one bit latch and a third one bit latch;

wherein the one or more managing circuits store results of the group of read operations in the first one bit latch, the one or more managing circuits store results of the set of the read operations in the first one bit latch and a second one bit latch, the one or more managing circuits use the third one bit latch to indicate whether the first one bit latch and a second one bit latch have valid data from the set of the read operations.

9. A non-volatile storage system according to claim 1, wherein:

the group of read operations includes testing for a first condition of the neighbor non-volatile storage element, testing for a second condition of the neighbor non-volatile storage element, testing for a third condition of the neighbor non-volatile storage element and testing for a fourth condition of the neighbor non-volatile storage element;

the first set of read operations includes a first subset of read operations, a second subset of read operations, and a third subset of read operations;

the first subset of read operations includes multiple read operations that apply a first voltage to the neighbor non-volatile storage element, the first voltage is associated with the first condition;

the second subset of read operations includes multiple read operations that apply a second voltage to the neighbor non-volatile storage element, the second voltage is associated with the second condition and the third condition;

the third subset of read operations includes multiple read operations that apply a third voltage to the neighbor non-volatile storage element, the third voltage is associated with the fourth condition;

the first subset of read operations are performed after the testing for the first condition and prior to the testing for the second condition;

the second subset of read operations are performed after the testing for the second condition and testing for the third condition, the second set of read operations are performed before the testing for the fourth condition; and the third subset of read operations are performed after the testing for the fourth condition.

10. A non-volatile storage system according to claim 1, wherein:

the group of read operations includes testing for a first condition of the neighbor non-volatile storage element, testing for a second condition of the neighbor non-volatile storage element, and testing for a third condition of the neighbor non-volatile storage element;

the neighbor non-volatile storage element is capable of being in a fourth condition;

the set of read operations includes a first subset of read operations and a second subset of read operations;

the first subset of read operations includes multiple read operations that apply a first voltage to the neighbor non-volatile storage element, the first voltage is associated with the first condition and the fourth condition;

the second subset of read operations includes multiple read operations that apply a second voltage to the neighbor non-volatile storage element, the second voltage is associated with the second condition and the third condition;

the first subset of read operations are performed after the testing for the first condition and prior to the testing for the second condition; and the second subset of read operations are performed after the testing for the second condition and testing for the third condition.

11. A non-volatile storage system according to claim 1, wherein:

the group of read operations includes testing for a first condition of the neighbor non-volatile storage element, testing for a second condition of the neighbor non-volatile storage element, testing for a third condition of the neighbor non-volatile storage element and testing for a fourth condition of the neighbor non-volatile storage element;

the first set of read operations includes a first read operation, a second read operation and a third read operation;

the first read operation includes applying a first voltage to the neighbor non-volatile storage element, the first voltage is associated with the first condition;

the second read operation includes applying a second voltage to the neighbor non-volatile storage element, the second voltage is associated with the second condition and the third condition;

the third read operation includes applying a third voltage to the neighbor non-volatile storage element, the third voltage is associated with the fourth condition;

the first read operation is performed after the testing for the first condition and prior to the testing for the second condition;

the second read operation is performed after the testing for the second condition and testing for the third condition, the second read operation is performed before the testing for the fourth condition; and the third read operation is are performed after the testing for the fourth condition.

12. A non-volatile storage system according to claim 1, wherein:

the one or more managing circuits include any one or combination of power control circuitry, address decoder circuits, a state machine circuit, a controller circuit and read/write circuits; and the group of read operations are started prior to starting the set of read operations.

13. A non-volatile storage system according to claim 1, wherein:

the set of non-volatile storage elements are multi-state flash memory devices.

14. A non-volatile storage system according to claim 1, wherein:

the set of non-volatile storage elements are multi-state NAND flash memory devices.

15. A non-volatile storage system, comprising:

a set of non-volatile storage elements including a first non-volatile storage element and a second non-volatile storage element; and means for reading data from the first non-volatile storage element in response to a particular request to read the data, comprising:

means for performing a first set of read operations on the first non-volatile storage element, at least a subset of the first set of read operations apply different voltages to a second non-volatile storage element, means for performing a second set of read operations on the second non-volatile storage element, the second set of read operations are at least partially temporally intermixed with the first set of read operations, means for choosing information from a subset of the first set of read operations based on the second set of read operations, and means for reporting data in the first non-volatile storage element based on the chosen information.

16. A non-volatile storage system according to claim 15, wherein:

each of the different voltages is associated with a different condition of the second non-volatile storage element.

17. A non-volatile storage system according to claim 15, wherein:

at least one of the second set of read operations is performed prior to the first set of read operations.

18. A non-volatile storage system according to claim 15, wherein:

the first non-volatile storage element and the second non-volatile storage element are part of a NAND string that includes other non-volatile storage elements;

at least one read operation of the first set of read operations applies a read compare voltage to the first non-volatile storage element, a first overdrive voltage to the second non-volatile storage element and a second overdrive voltage to the other non-volatile storage elements;

at least another read operation of the first set of read operations applies the read compare voltage to the first non-volatile storage element, a third overdrive voltage to the second non-volatile storage element and the second overdrive voltage to the other non-volatile storage elements; and the first overdrive voltage is different than the second overdrive voltage.

19. A non-volatile storage system, comprising:

a group of non-volatile storage elements including a first set of non-volatile storage elements and a second set of non-volatile storage elements; and one or more managing circuits in communication with the group of non-volatile storage elements, the one or more managing circuits test the second set of non-volatile storage elements for a first condition and test the second set of non-volatile storage elements for a second condition, the one or more managing circuits perform a first set of one or more read operations for the first set of non-volatile storage elements while applying a first voltage to the second set of non-volatile storage elements, the first voltage is associated with the first condition, the one or more managing circuits perform a second set of one or more read operation for the first set of non-volatile storage elements while applying a second voltage to the second set of non-volatile storage elements, the second voltage is associated with the second condition, the first set of one or more read operations is performed after the one or more managing circuits test for the first condition and before the one or more managing circuits test for the second condition, the second set of one or more read operations is performed after the one or more managing circuits test for the second condition, the one or more managing circuits identify data based on the first set of one or more read operations for non-volatile storage elements of the first set of non-volatile storage elements that are next to non-volatile storage elements of the second set of non-volatile storage elements having the first condition, the one or more managing circuits identify data based on the second set of one or more read operations for non-volatile storage elements of the first set of non-volatile storage elements that are next to non-volatile storage elements of the second set of non-volatile storage elements having the second condition.

20. A non-volatile storage system according to claim 19, further comprising:

a first word line in communication with the one or more managing circuits and the first set of non-volatile storage elements;

a second word line in communication with the one or more managing circuits and the second set of non-volatile storage elements, the first set of non-volatile storage elements and the second set of non-volatile storage elements are in a block with other non-volatile storage elements;

other word lines in communication with the one or more managing circuits and the other non-volatile storage elements;

the one or more managing circuits assert a first set of read compare voltages on the first word line during the first set of read operations and during the second set of read operations;

the one or more managing circuits assert the first voltage on the second word line during the first set of read operations;

the one or more managing circuits assert the second voltage on the second word line during the second set of read operations; and the one or more managing circuits assert a read overdrive voltage on the other word lines during the first set of read operations and during the second set of read operations.

21. A non-volatile storage system according to claim 19, wherein:

the one or more managing circuits test the second set of non-volatile storage elements for a third condition after the second set of one or more read operations, the one or more managing circuits perform a third set of one or more read operation for the first set of non-volatile storage elements while applying a third voltage to the second set of non-volatile storage elements, the third voltage is associated with the second condition, the one or more managing circuits identify data based on the third set of one or more read operations for non-volatile storage elements of the first set of non-volatile storage elements that are next to non-volatile storage elements of the second set of non-volatile storage elements having the third condition.

22. A non-volatile storage system according to claim 21, further comprising:

the one or more managing circuits perform a fourth set of one or more read operation for the first set of non-volatile storage elements while applying a fourth voltage to the second set of non-volatile storage elements, the third voltage is associated with a fourth condition, the one or more managing circuits identify data based on the fourth set of one or more read operations for non-volatile storage elements of the first set of non-volatile storage elements that are next to non-volatile storage elements of the second set of non-volatile storage elements having the fourth condition.

23. A non-volatile storage system according to claim 21, wherein:

the third condition corresponds to a single data state.

24. A non-volatile storage system according to claim 21, wherein:

the third condition corresponds to two data states.

25. A non-volatile storage system according to claim 19, wherein:

the group of non-volatile storage elements are multi-state NAND flash memory devices.

* * * * *

UNITED STATES PATENT AND TRADEMARK OFFICE

CERTIFICATE OF CORRECTION

PATENT NO. : 7,440,324 B2

APPLICATION NO. : 11/618578

DATED : October 21, 2008

INVENTOR(S) : Mokhlesi

It is certified that error appears in the above-identified patent and that said Letters Patent is hereby corrected as shown below:

Column 27, claim 11, line 20: After “is” and before “performed” delete “are”.

Signed and Sealed this

Twenty-first Day of April, 2009

JOHN DOLL

*Acting Director of the United States Patent and Trademark Office*